(12) United States Patent
Zhang et al.

(10) Patent No.: US 9,607,893 B1
(45) Date of Patent: Mar. 28, 2017

(54) METHOD OF FORMING SELF-ALIGNED METAL LINES AND VIAS

(71) Applicant: GLOBALFOUNDRIES INC., Grand Cayman (KY)

(72) Inventors: John H. Zhang, Altamont, NY (US); Carl J. Radens, Lagrangeville, NY (US); Lawrence A. Clevenger, Rhinebeck, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/202,949

(22) Filed: Jul. 6, 2016

(51) Int. Cl.
  *H01L 21/302* (2006.01)
  *H01L 21/461* (2006.01)
  *H01L 21/768* (2006.01)

(52) U.S. Cl.
  CPC .. H01L 21/76897 (2013.01); H01L 21/76808 (2013.01); H01L 21/76831 (2013.01)

(58) Field of Classification Search
  None
  See application file for complete search history.

(56) References Cited

U.S. PATENT DOCUMENTS

| | | | |
|---|---|---|---|
| 5,795,823 A | 8/1998 | Avanzino et al. | |
| 6,287,952 B1 | 9/2001 | Harris | |
| 9,236,342 B2 | 1/2016 | Bristol et al. | |
| 9,240,374 B2 | 1/2016 | Shao et al. | |
| 9,287,135 B1 * | 3/2016 | Doris | H01L 21/31144 |
| 9,324,650 B2 | 4/2016 | Edelstein et al. | |
| 2004/0021196 A1 | 2/2004 | Brennan et al. | |
| 2004/0140486 A1 * | 7/2004 | Lee | H01L 21/31144 257/208 |
| 2004/0164328 A1 * | 8/2004 | Lee | H01L 27/10888 257/213 |
| 2004/0188806 A1 * | 9/2004 | Chung | H01L 21/76829 257/621 |
| 2010/0090346 A1 | 4/2010 | Torres et al. | |
| 2014/0015135 A1 | 1/2014 | Rieger et al. | |
| 2014/0361352 A1 * | 12/2014 | Hung | H01L 21/28008 257/288 |
| 2014/0363969 A1 | 12/2014 | Chen et al. | |
| 2015/0035157 A1 | 2/2015 | Holmes et al. | |
| 2015/0084196 A1 | 3/2015 | Riess et al. | |
| 2015/0380246 A1 * | 12/2015 | Hu | H01L 21/0332 438/736 |
| 2016/0056104 A1 | 2/2016 | Bouche et al. | |

* cited by examiner

*Primary Examiner* — Angel Roman
(74) *Attorney, Agent, or Firm* — Gibb & Riley, LLC; Francois Pagette

(57) ABSTRACT

Disclosed are embodiments of a method, wherein metal lines and vias of an integrated circuit IC) metal level of are formed without requiring separate cut masks to pattern the trenches for the metal lines and the via holes for the vias. Trenches are formed in an upper portion of a dielectric layer. Each trench is filled with a sacrificial material. A mask is formed above the dielectric layer and patterned with one or more openings, each opening exposing one or more segments of the sacrificial material in one or more of the trenches, respectively. A sidewall spacer is formed in each opening and a selective etch process is performed to form one or more via holes that extend through the sacrificial material and through the lower portion of the dielectric layer below. Subsequently, all the sacrificial material is removed and metal is deposited, thereby forming self-aligned metal lines and via(s).

20 Claims, 35 Drawing Sheets

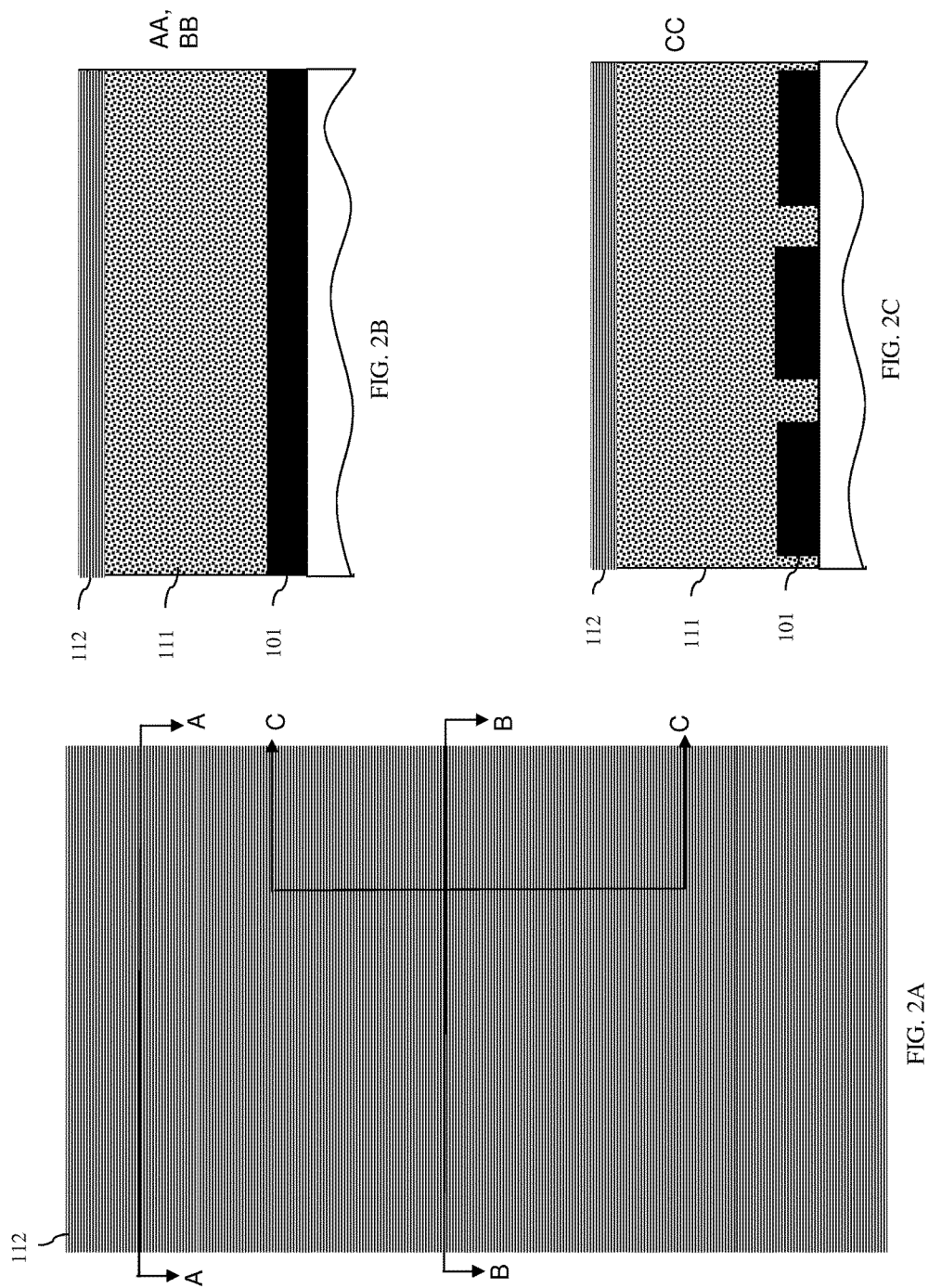

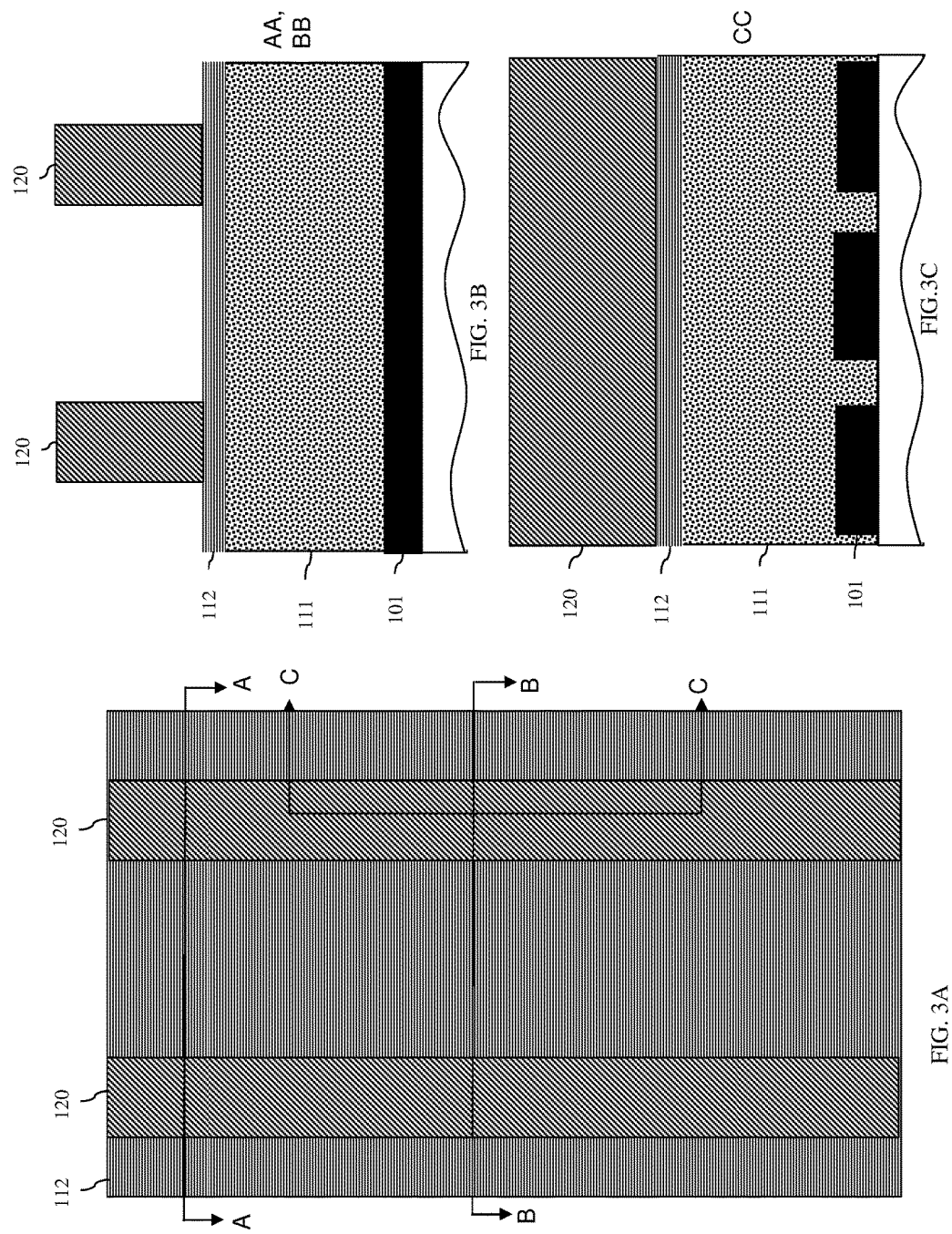

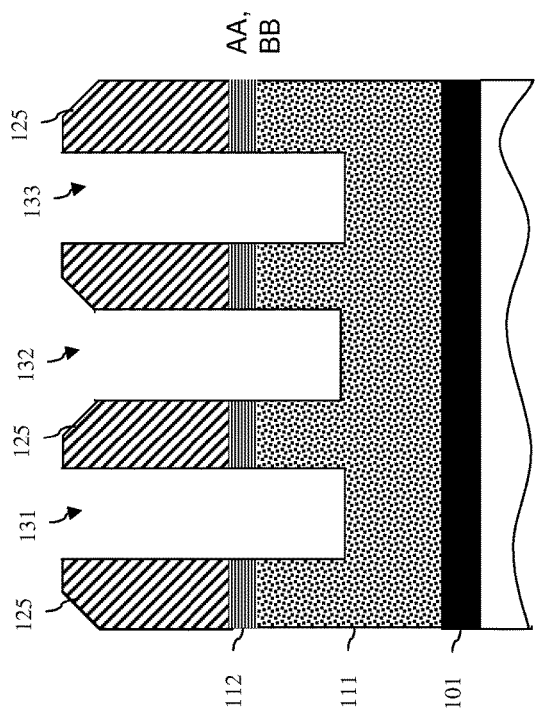
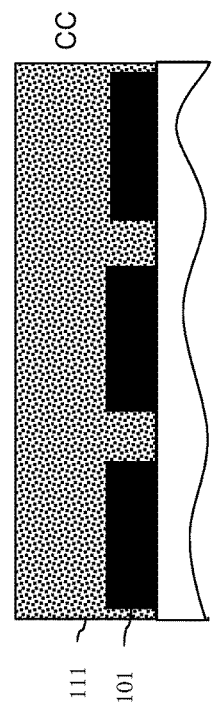
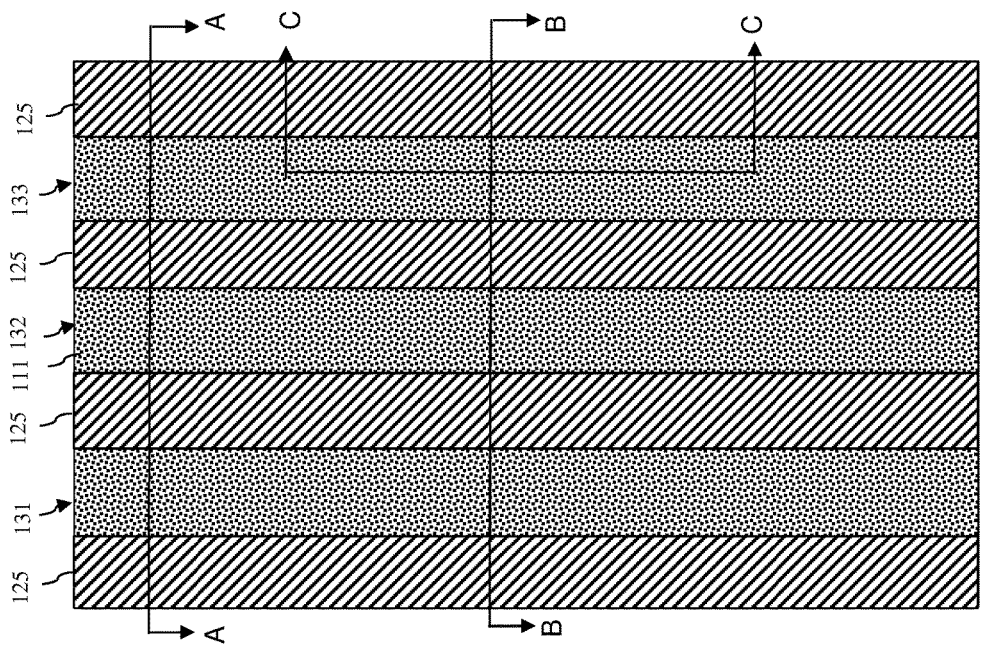
FIG. 5B
FIG. 5C
FIG. 5A

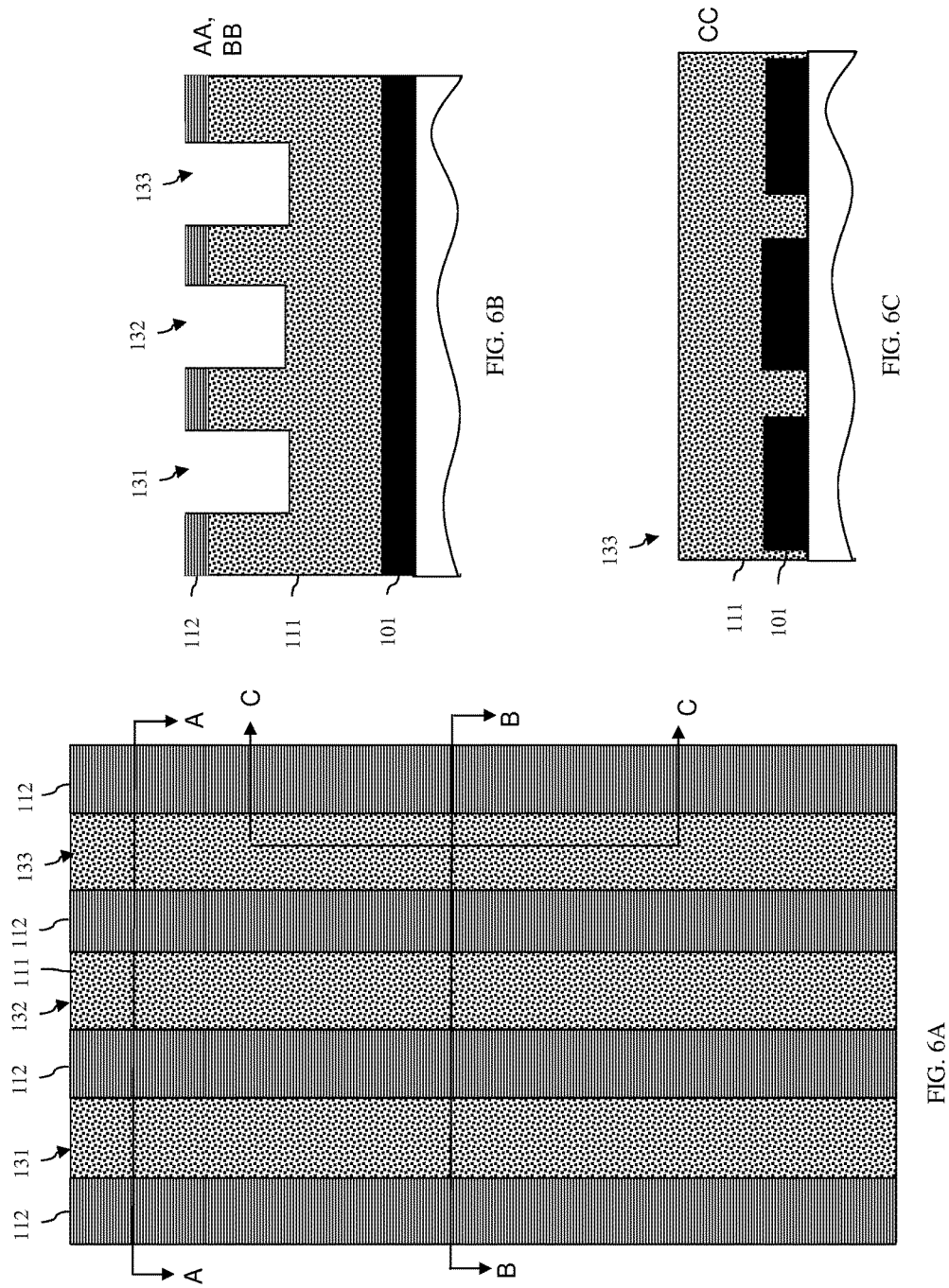

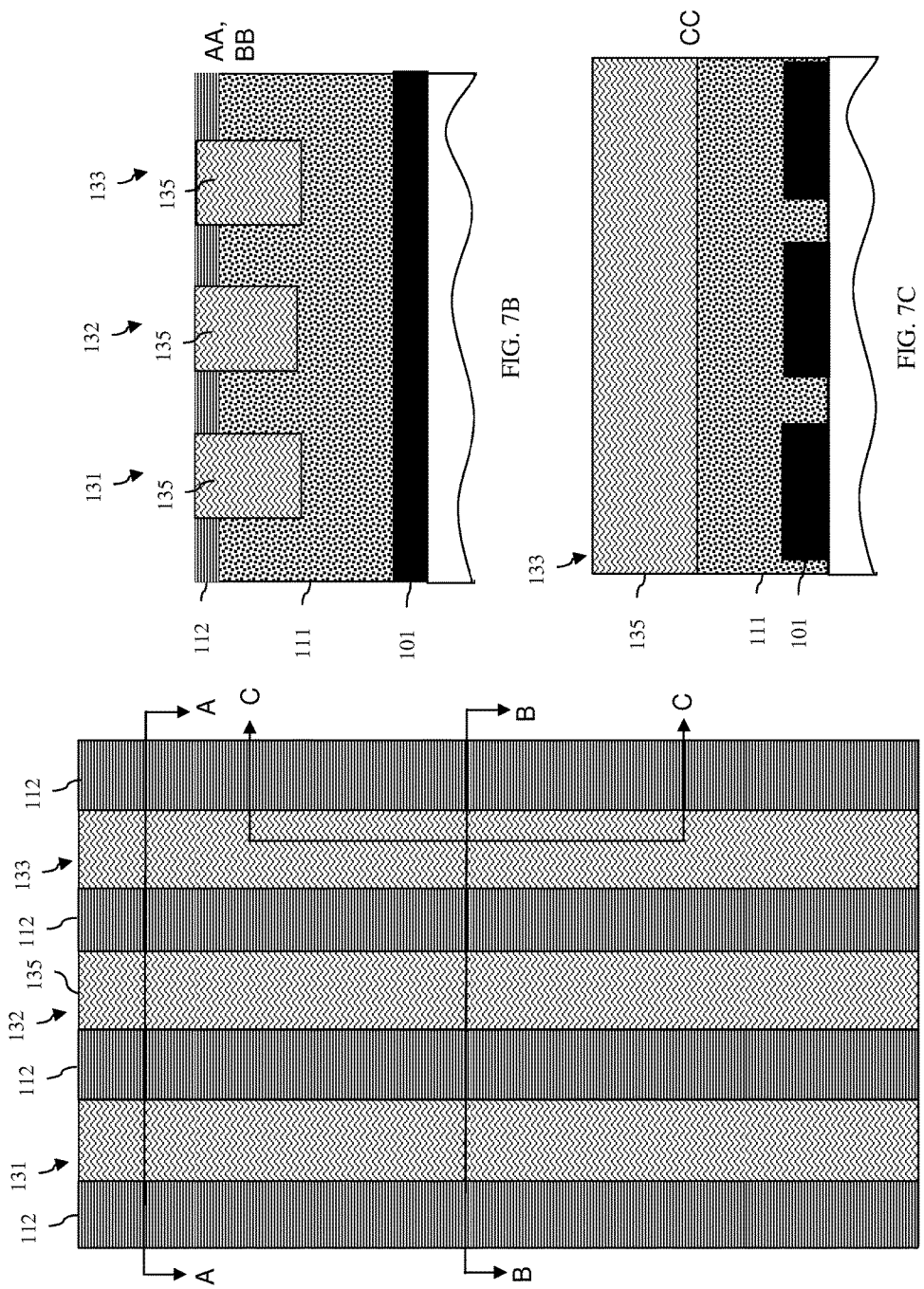

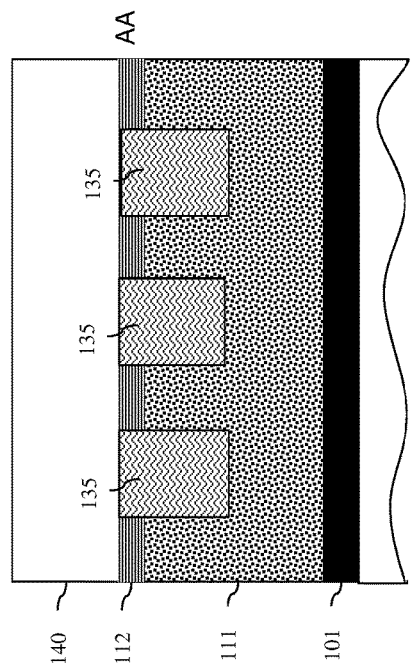
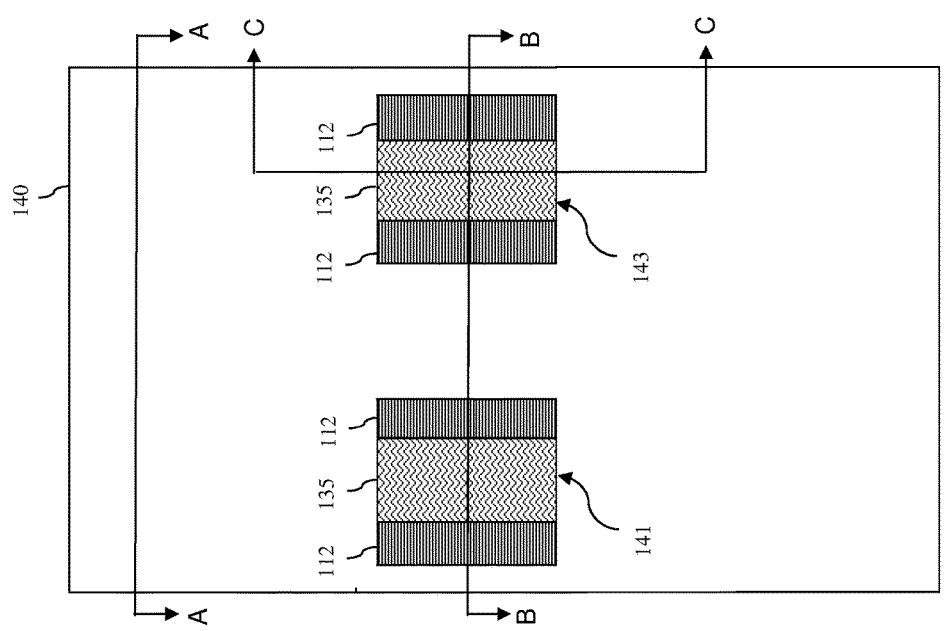
FIG. 8B
FIG. 8A

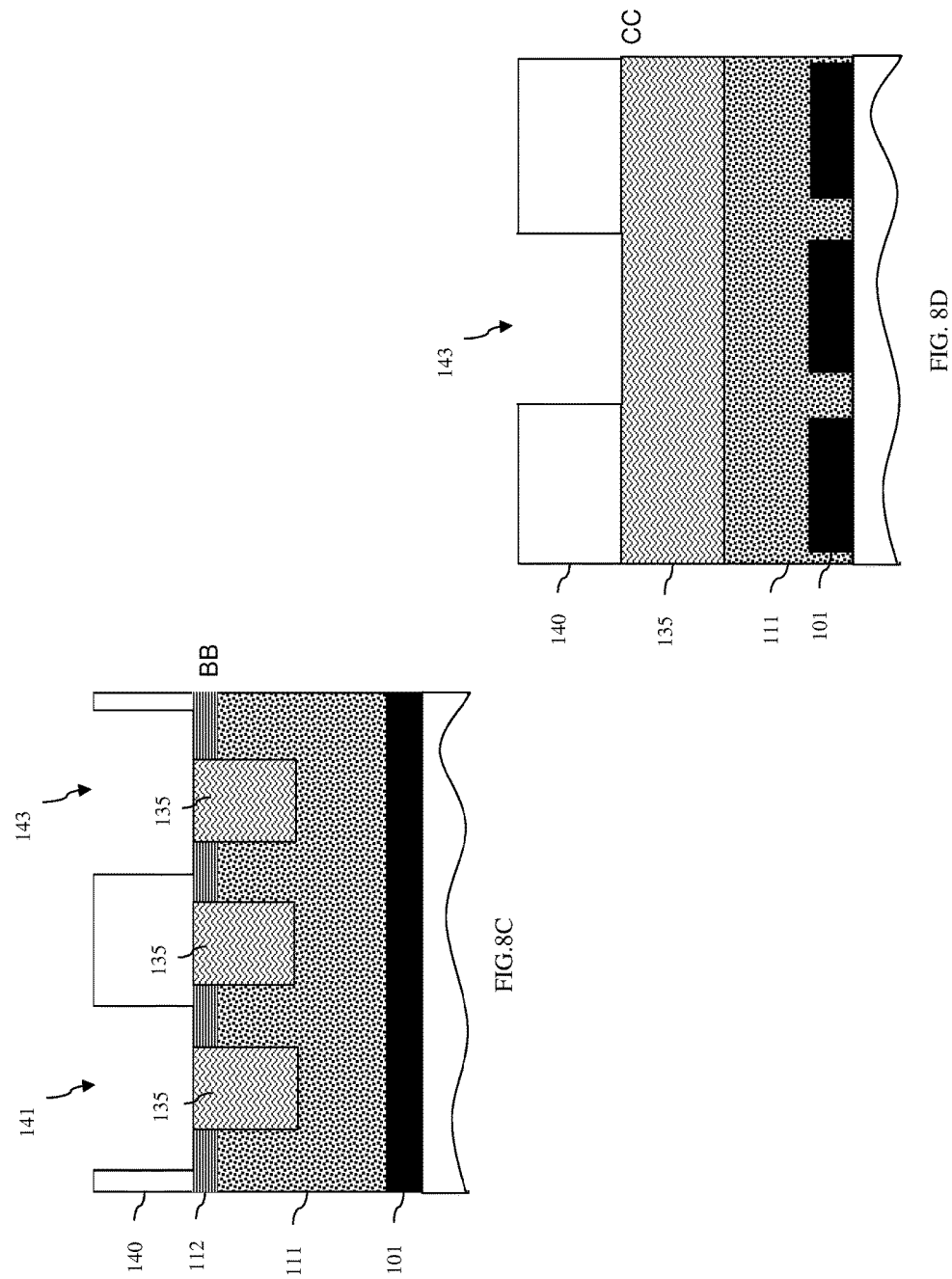

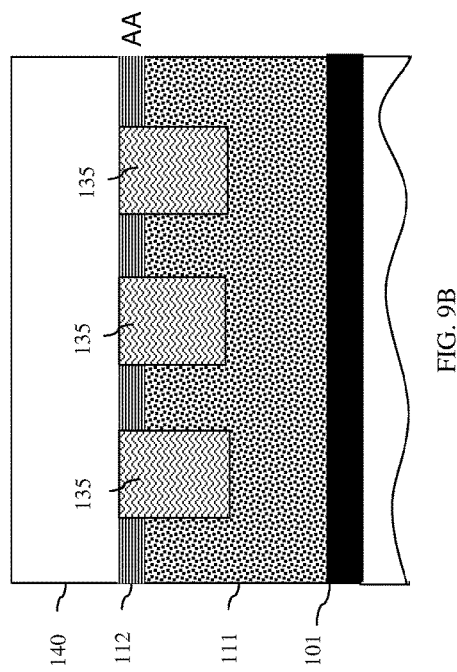
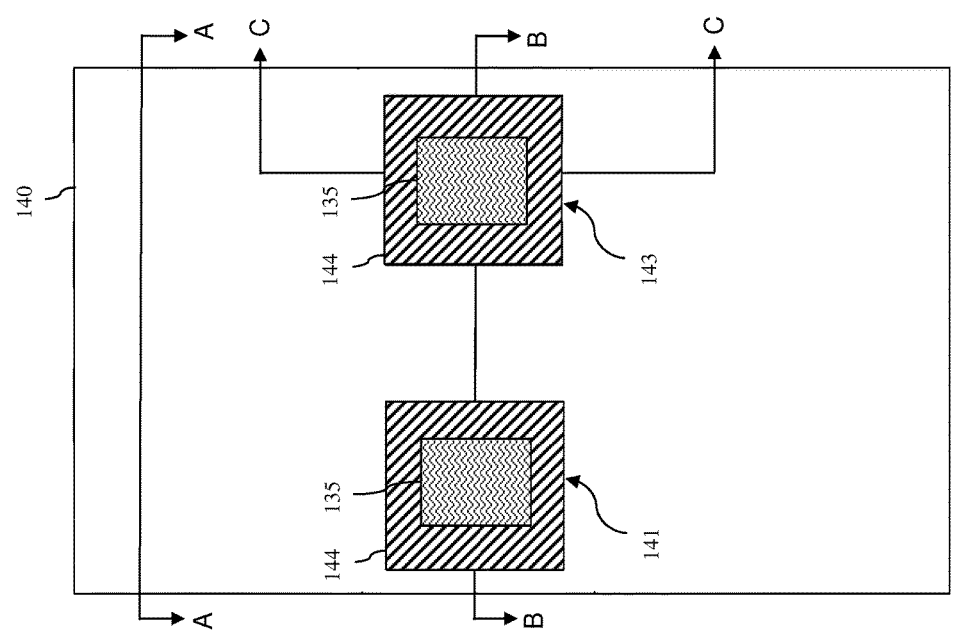
FIG. 9B
FIG. 9A

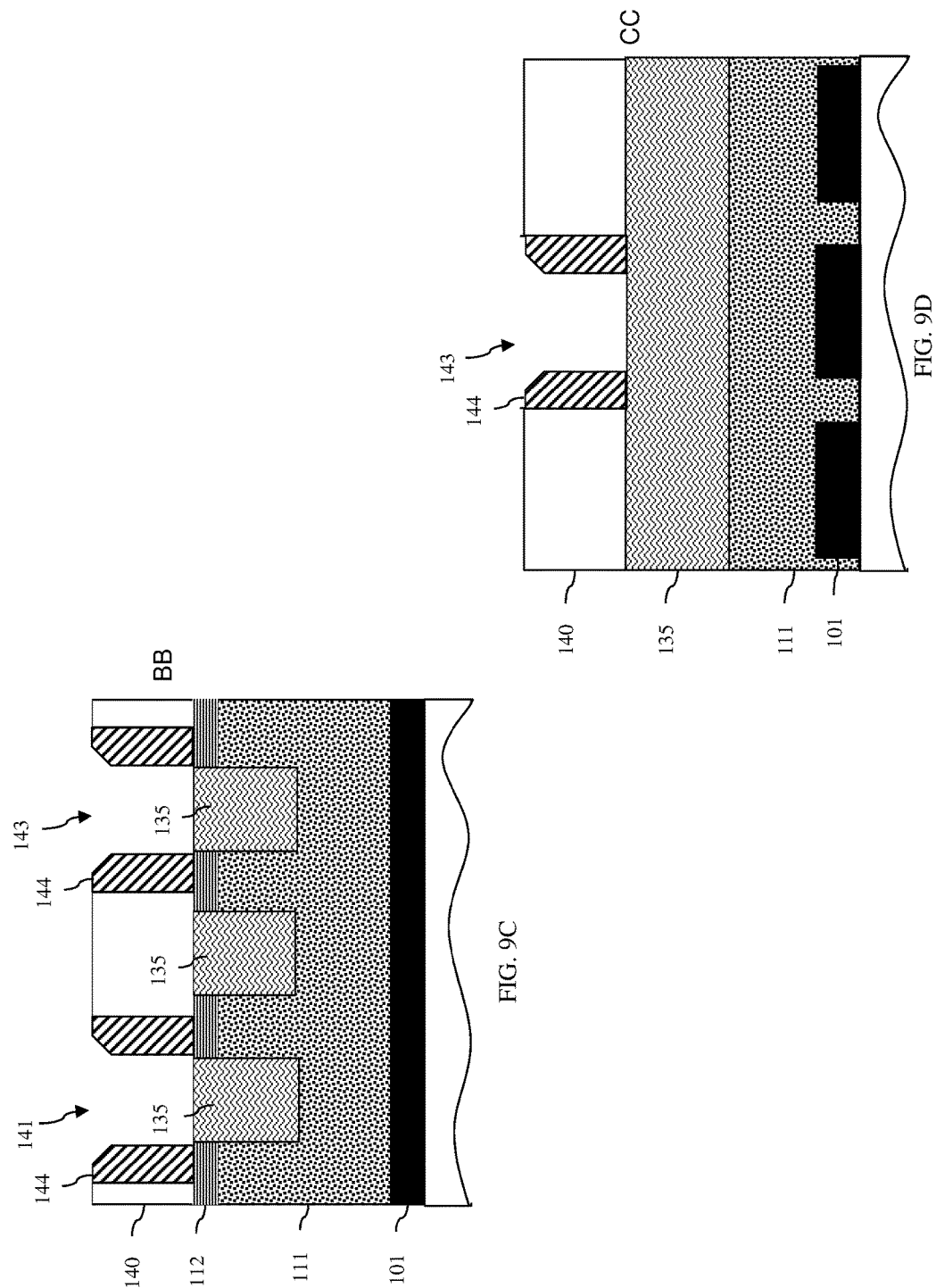

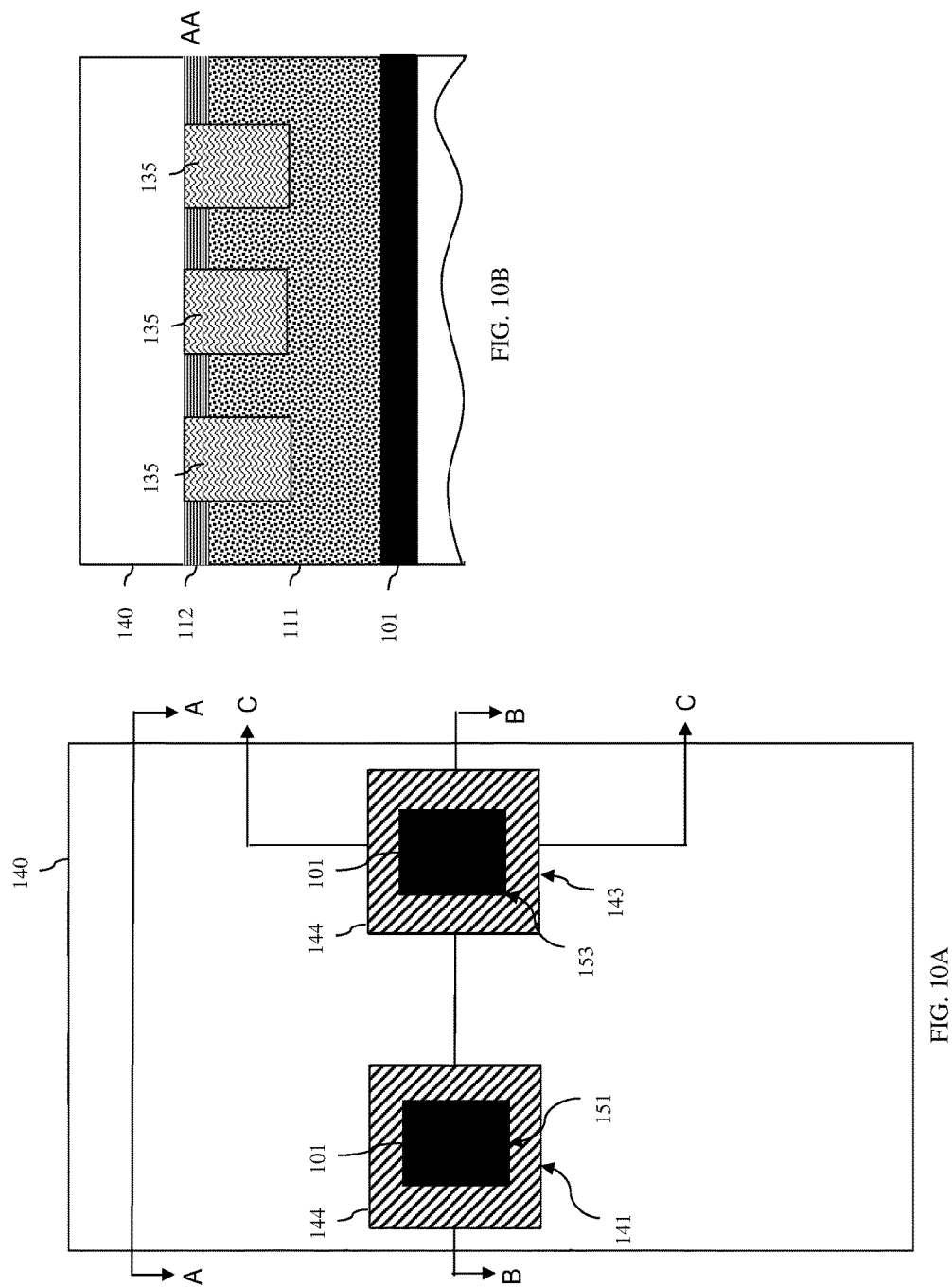

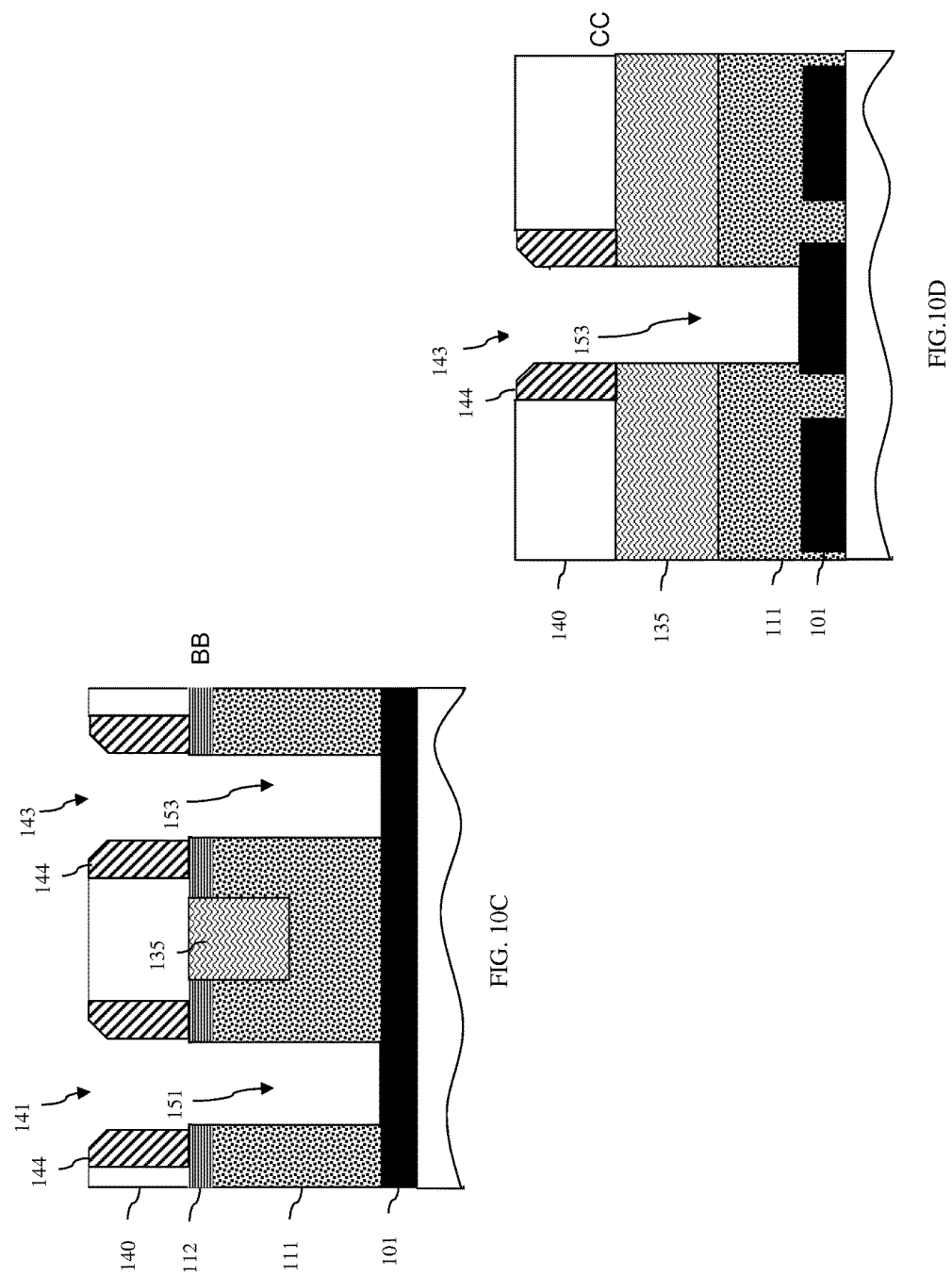

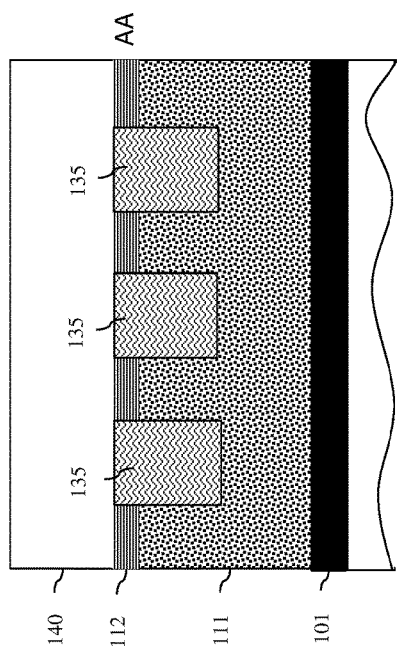
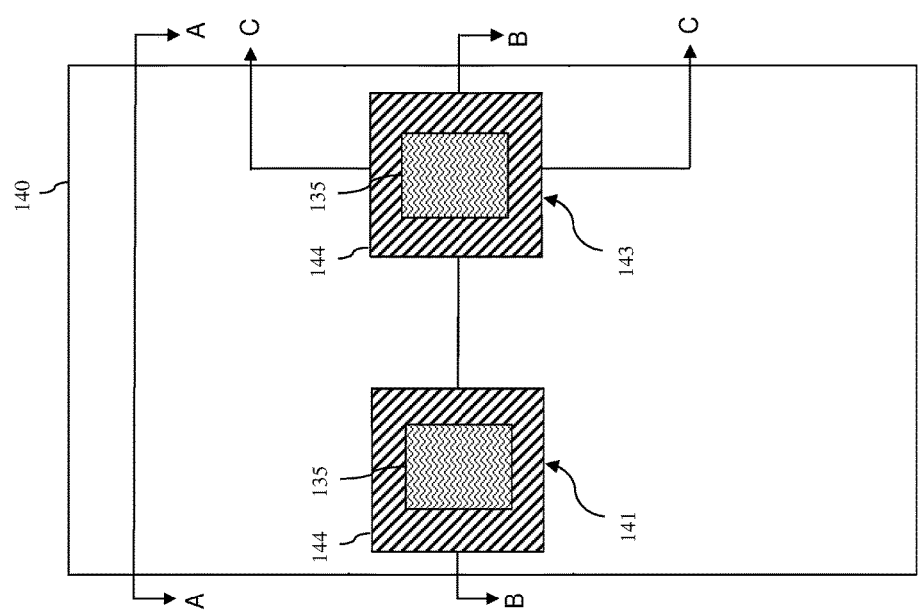
FIG. 11B
FIG. 11A

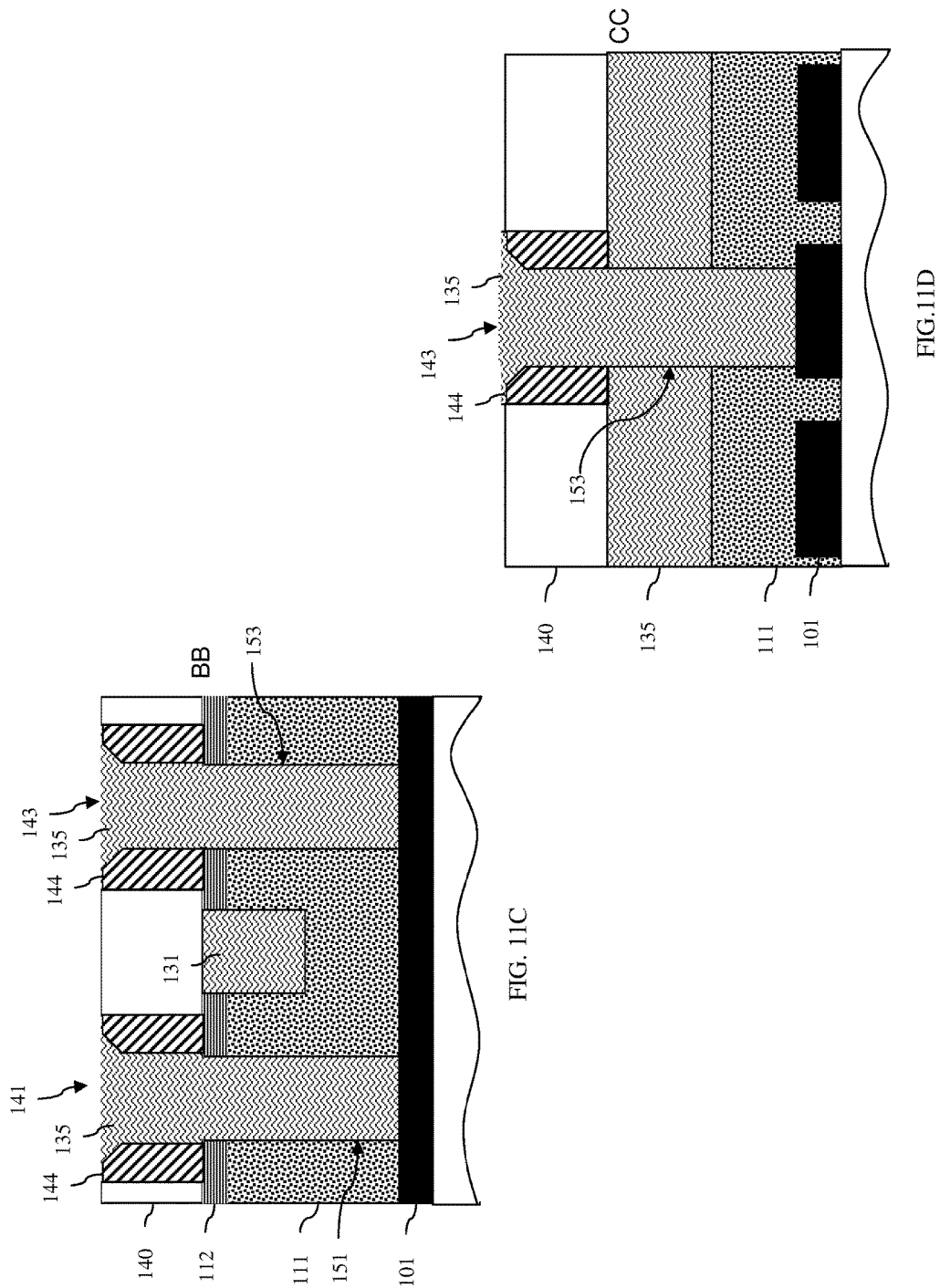

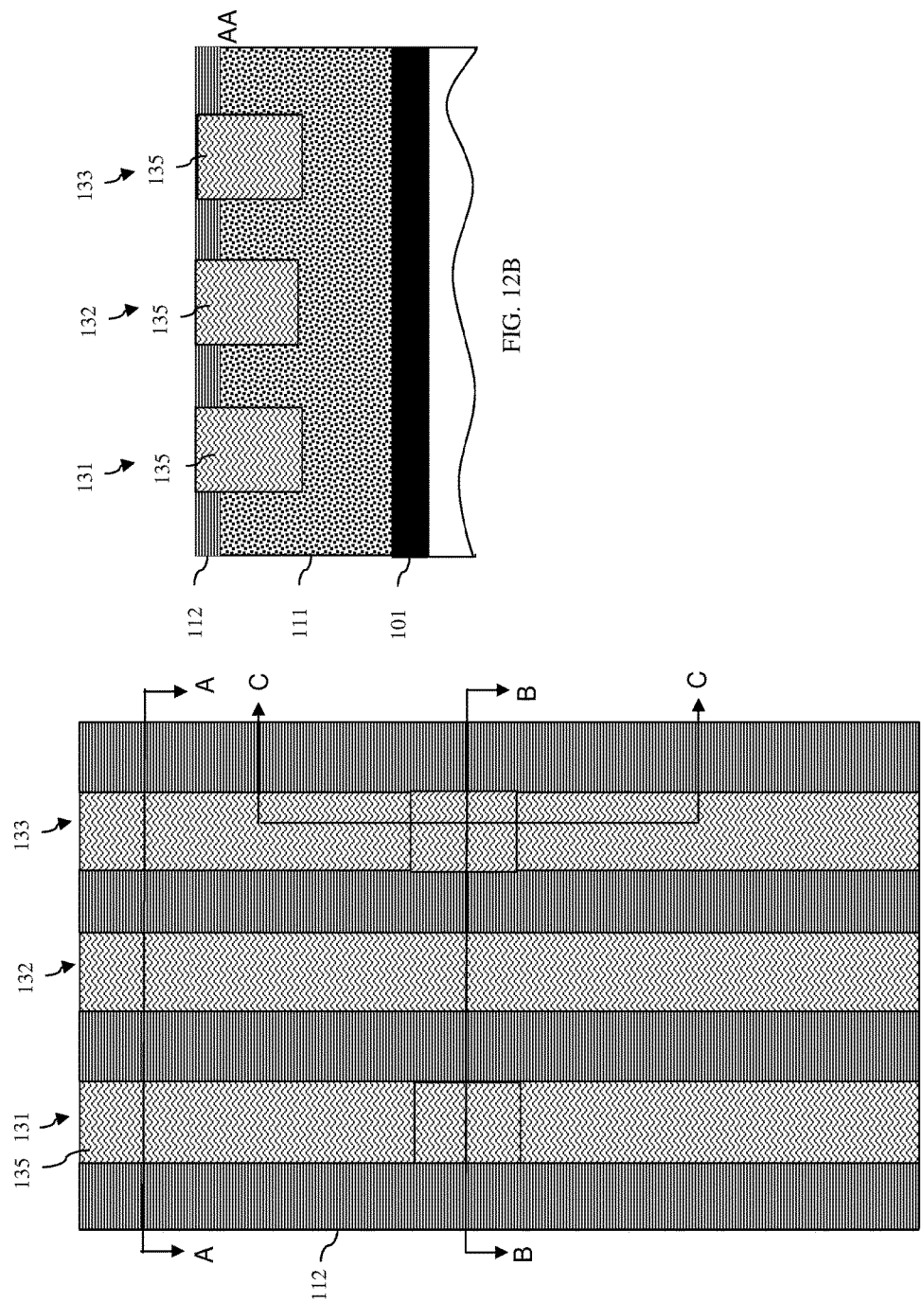

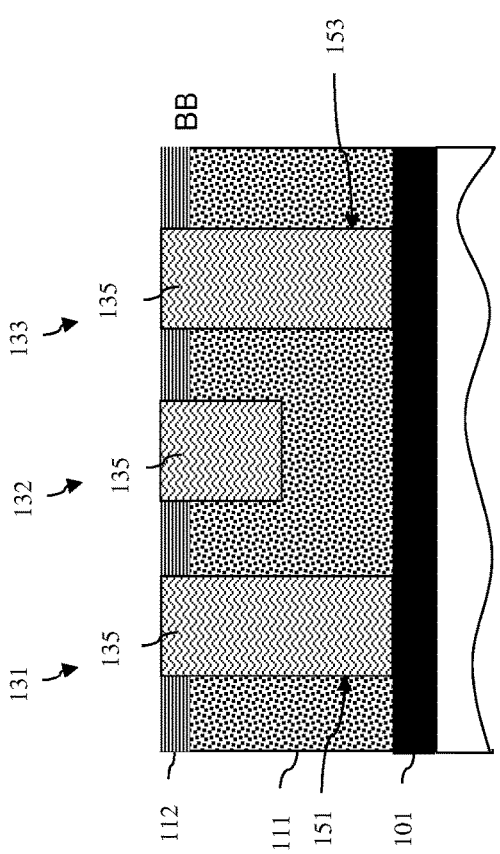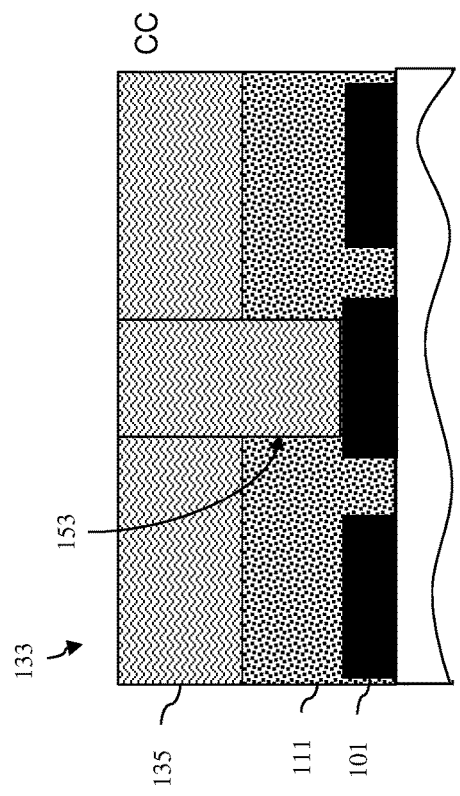
FIG. 12C
FIG. 12D

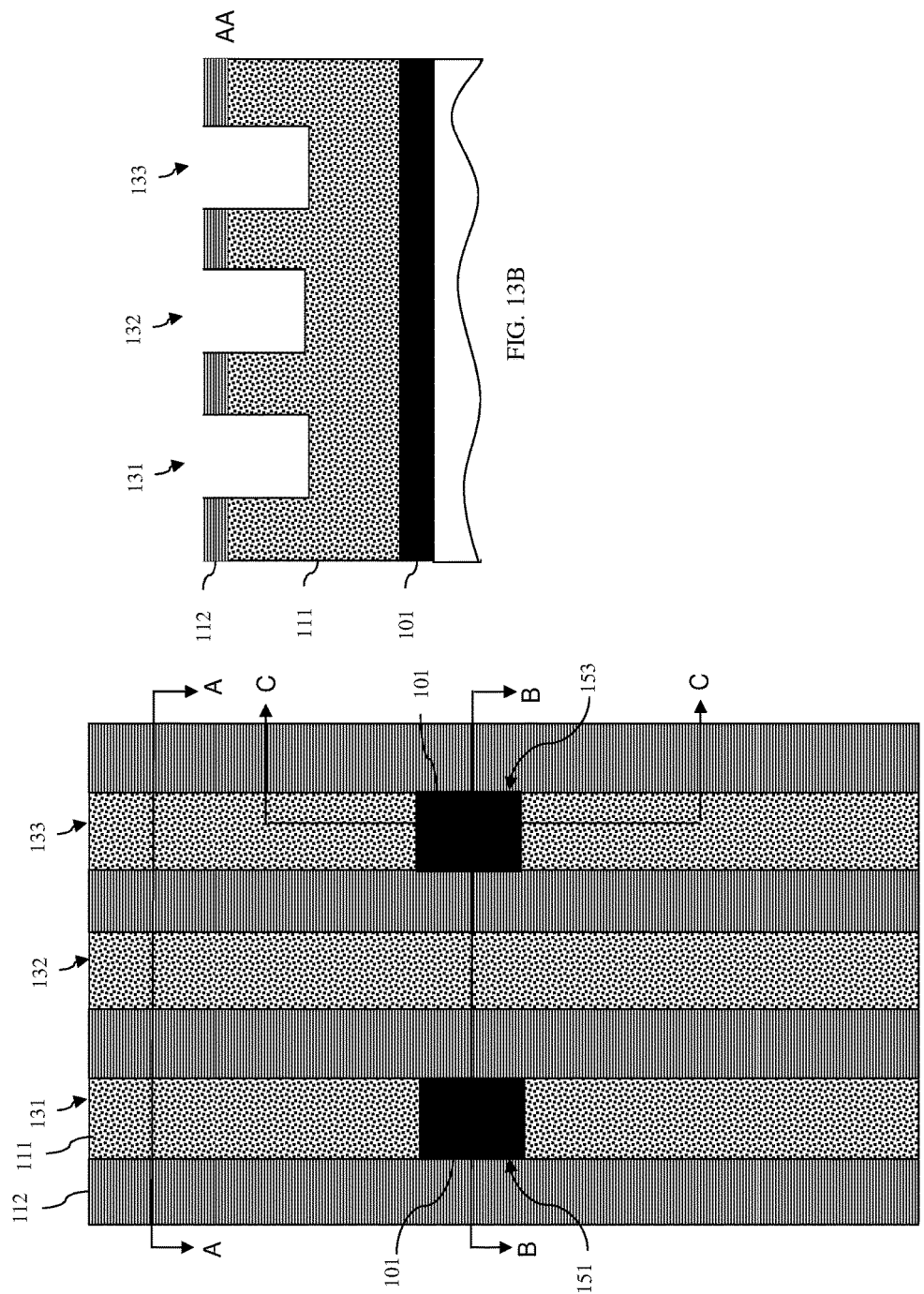

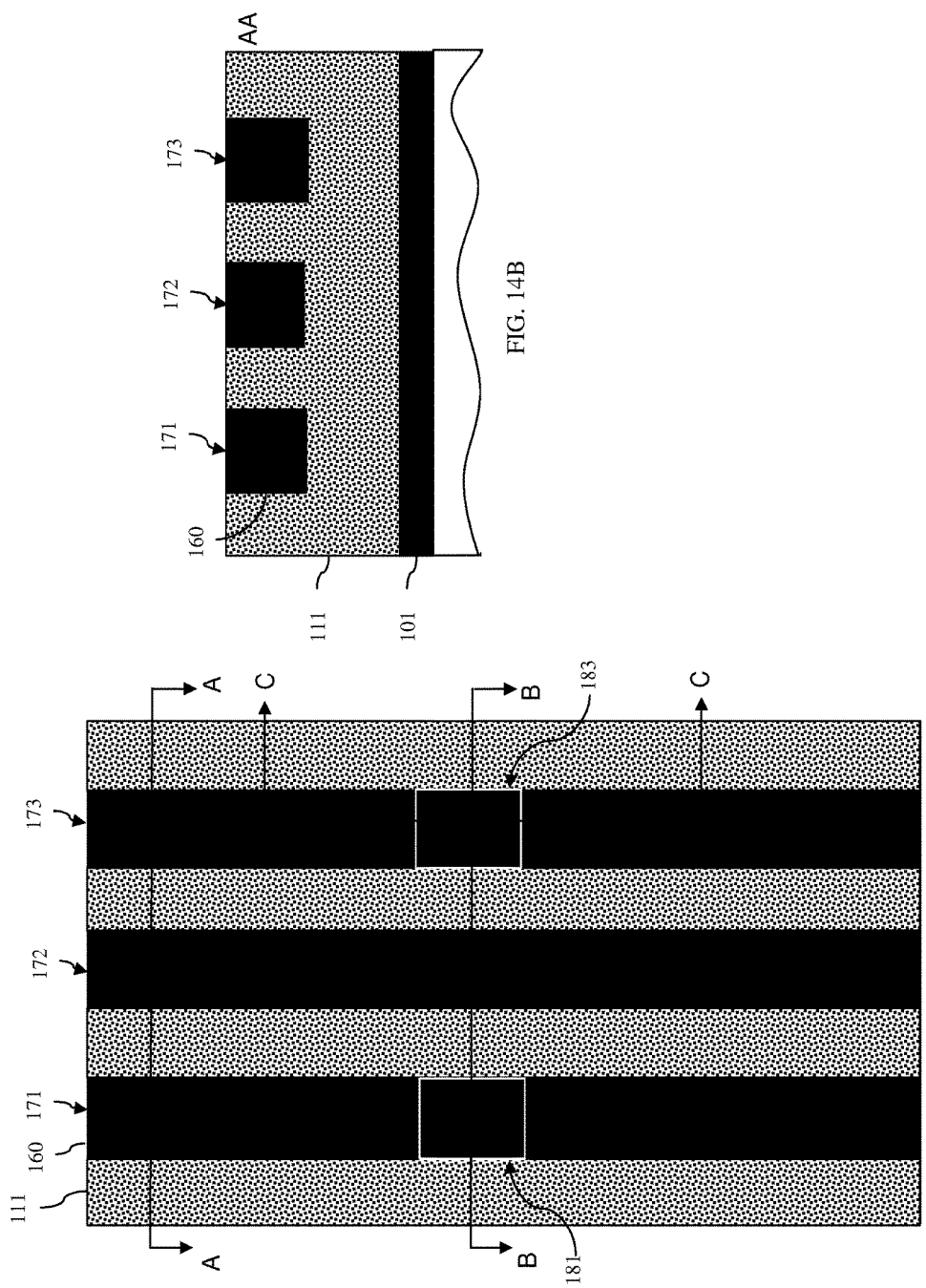

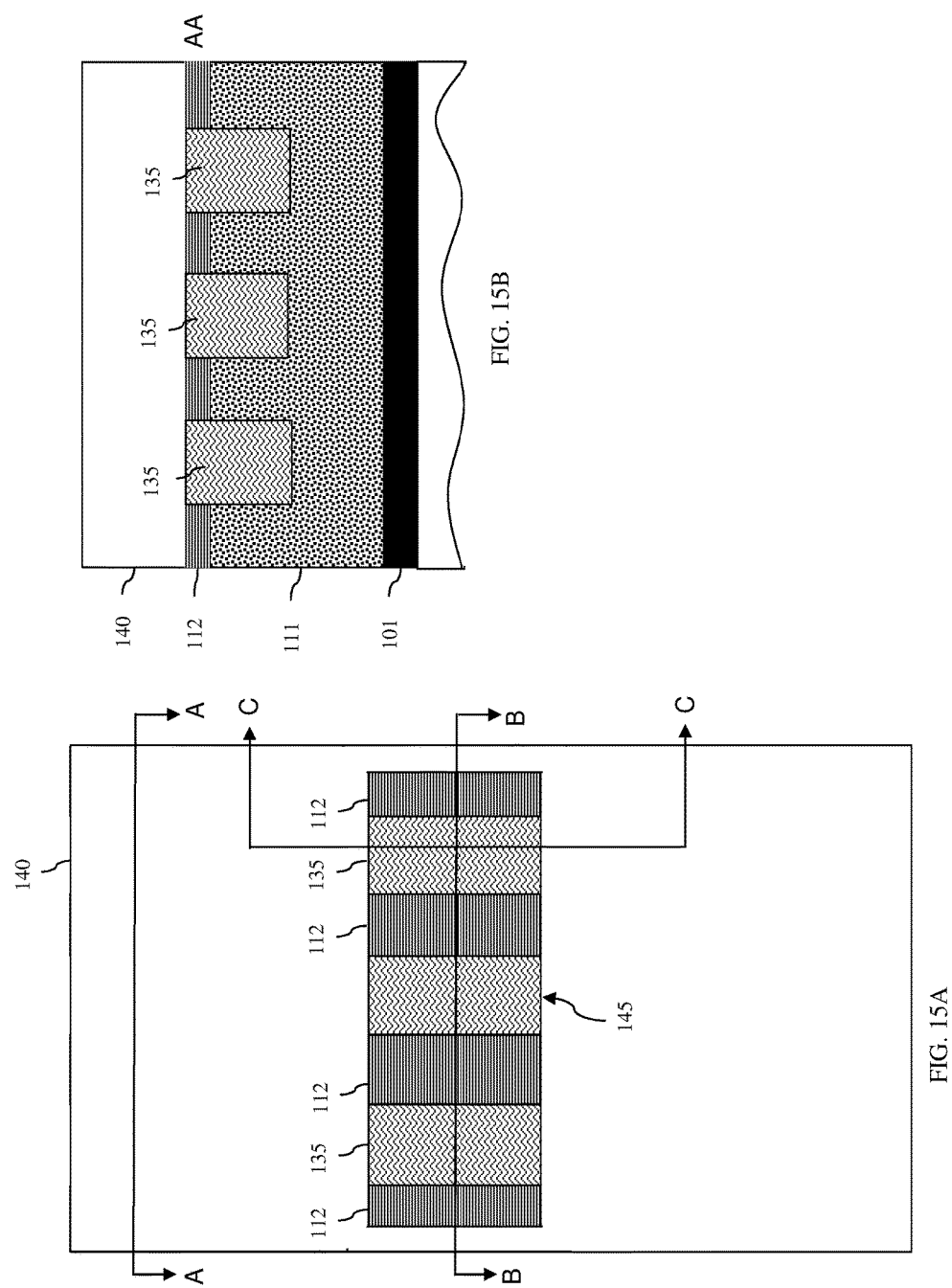

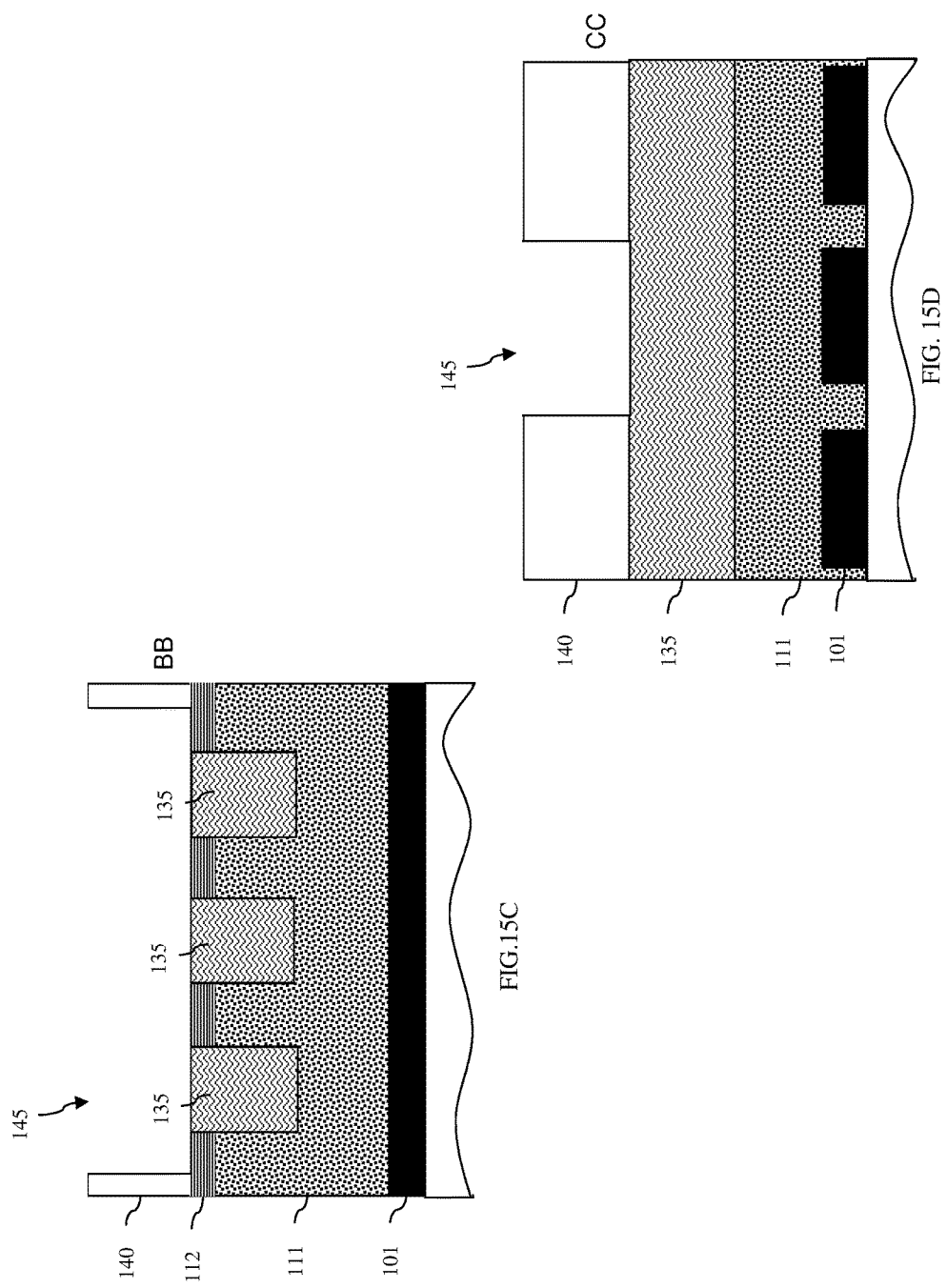

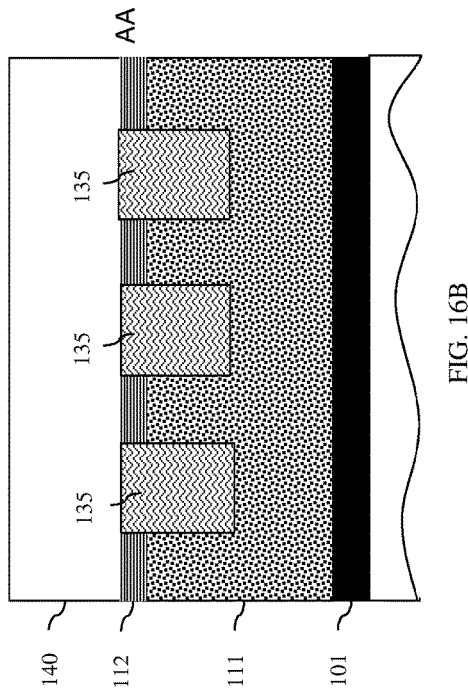
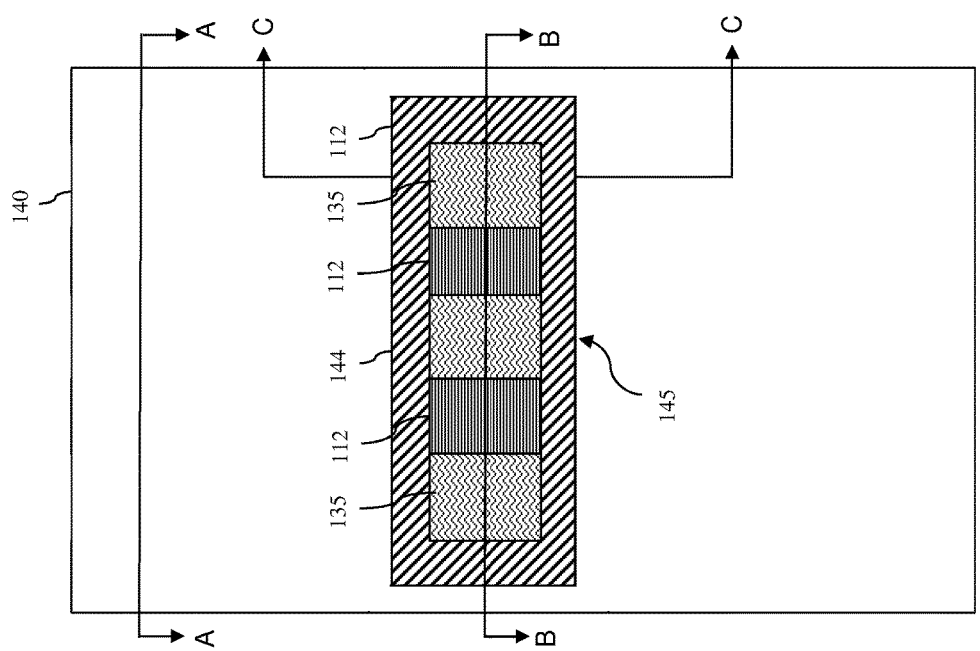
FIG. 16B
FIG. 16A

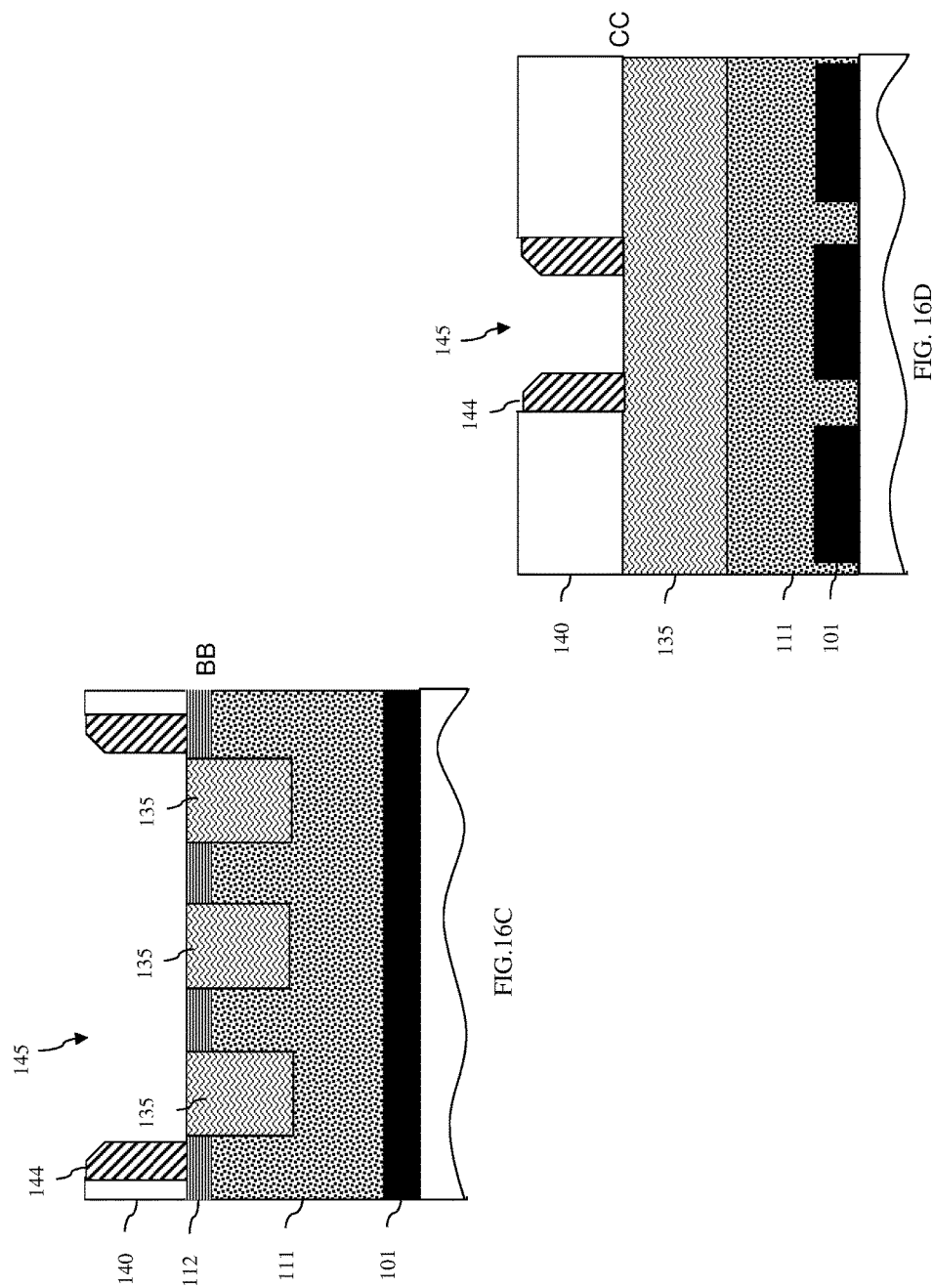

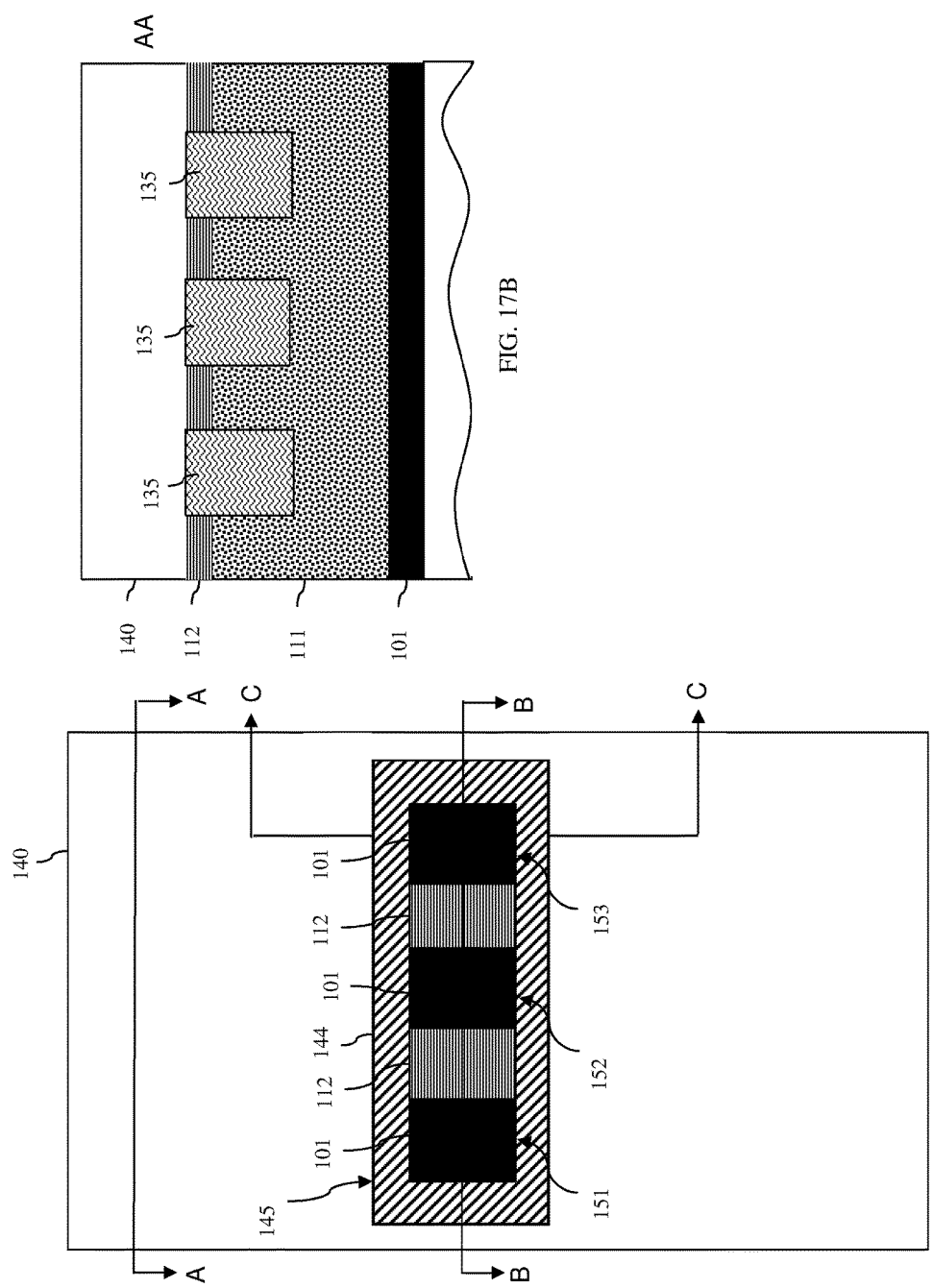

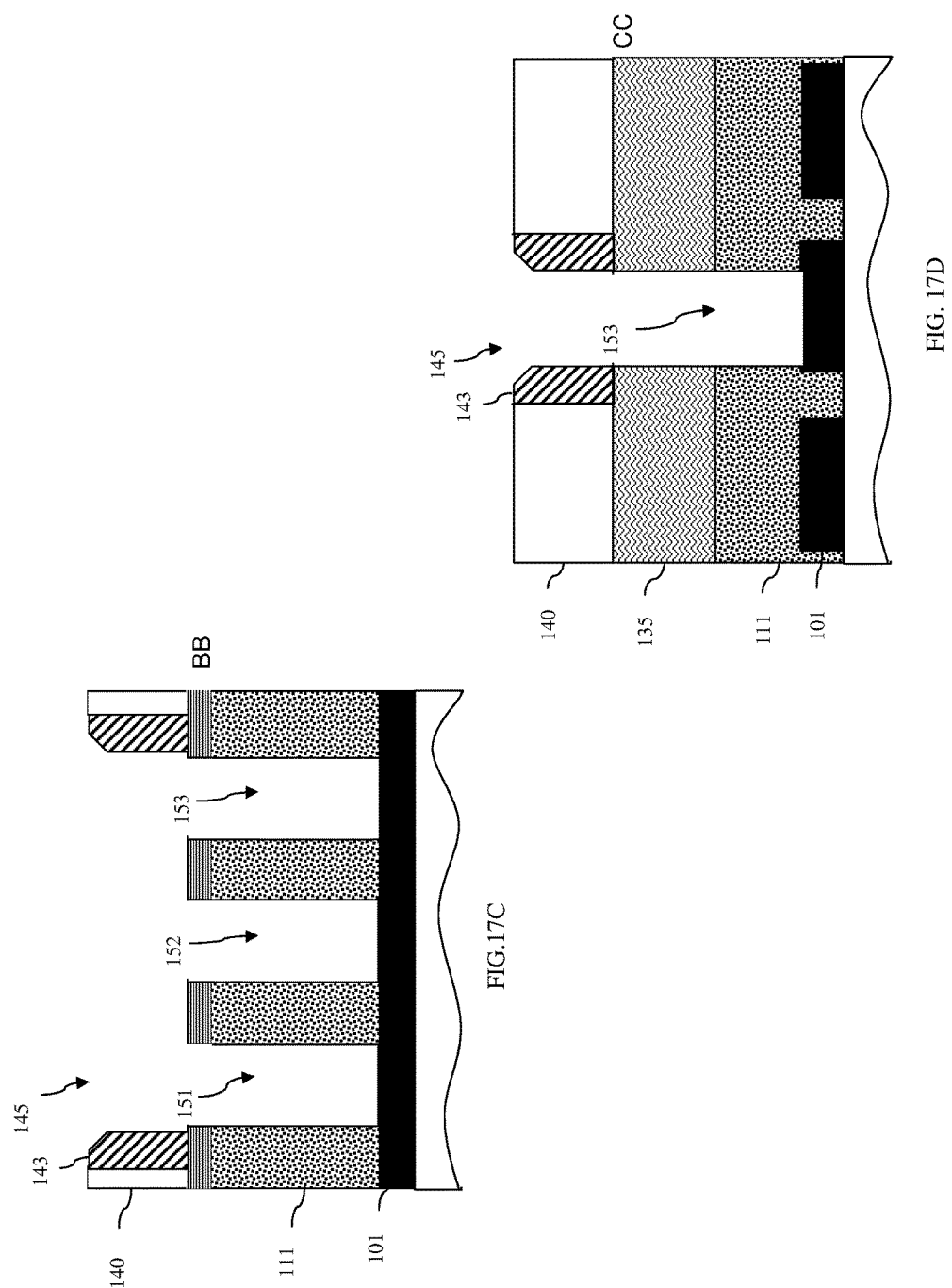

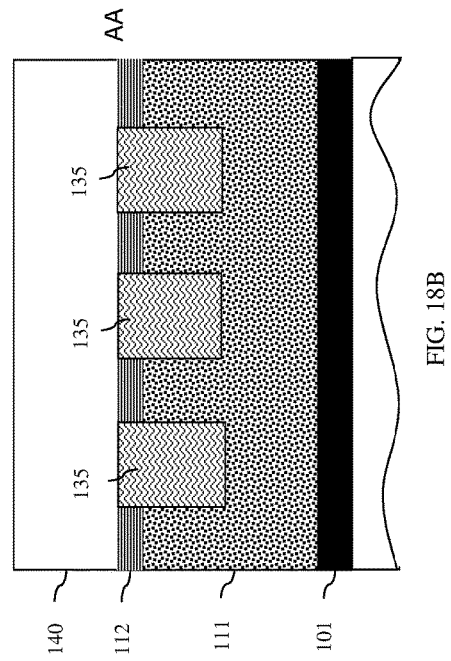
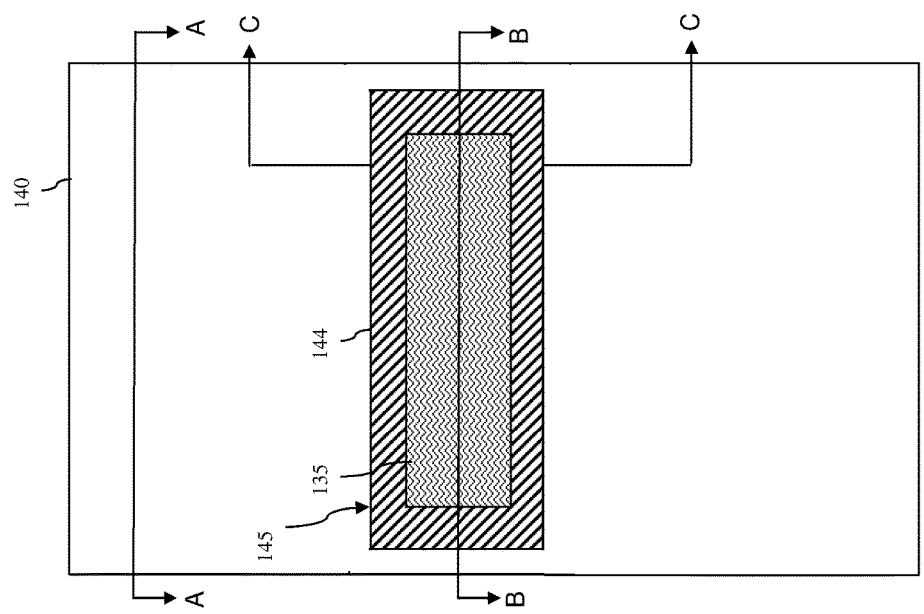

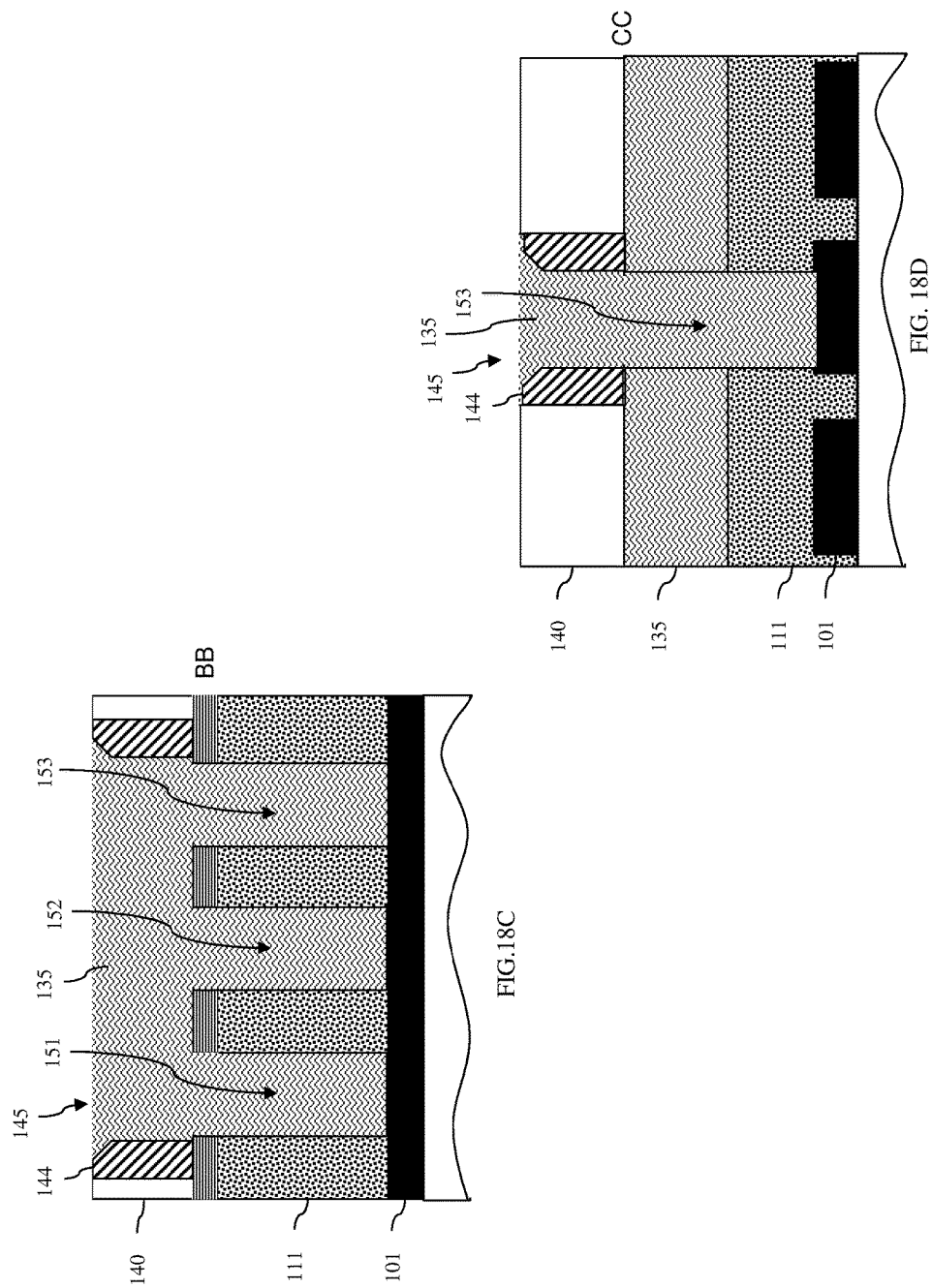

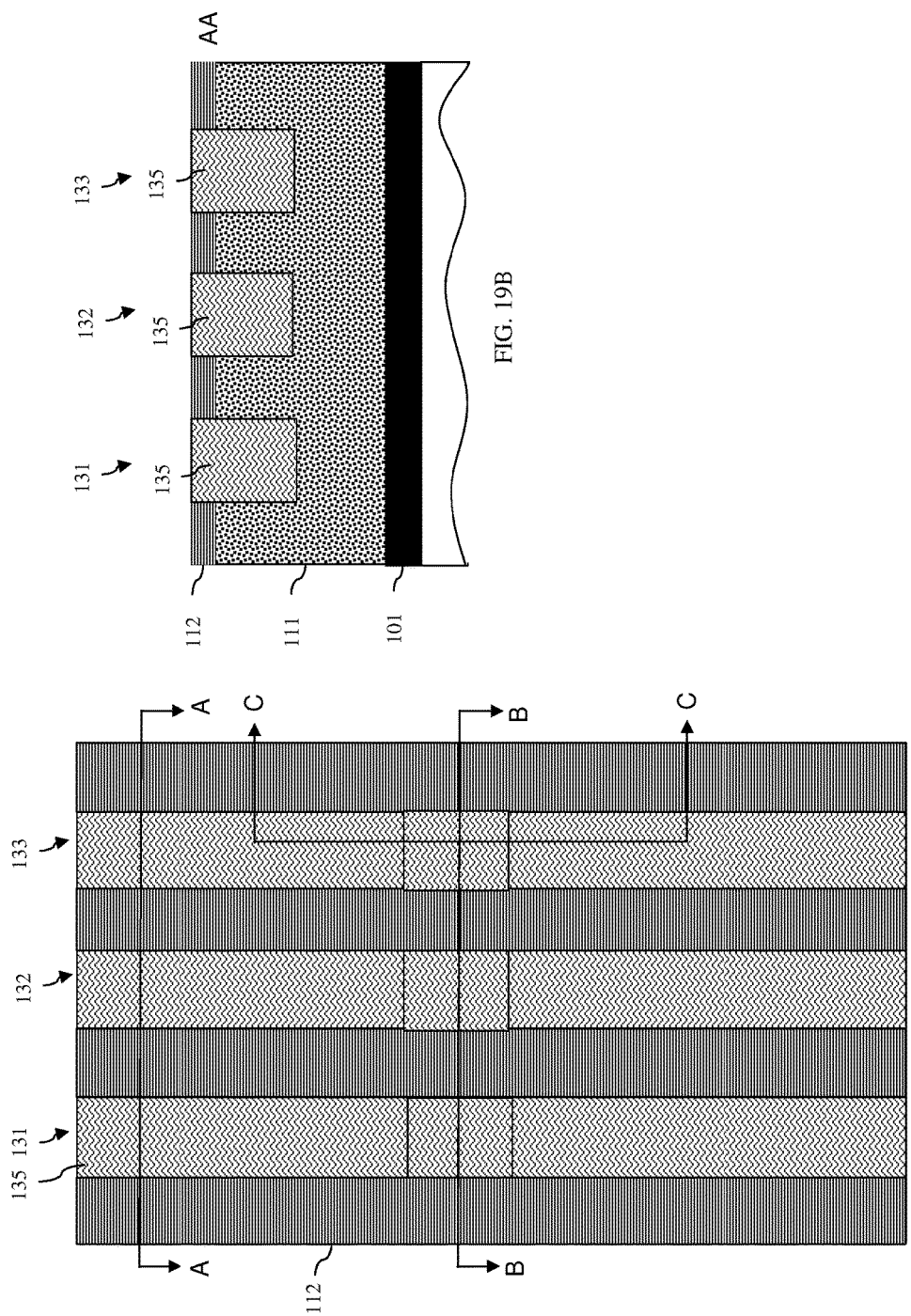

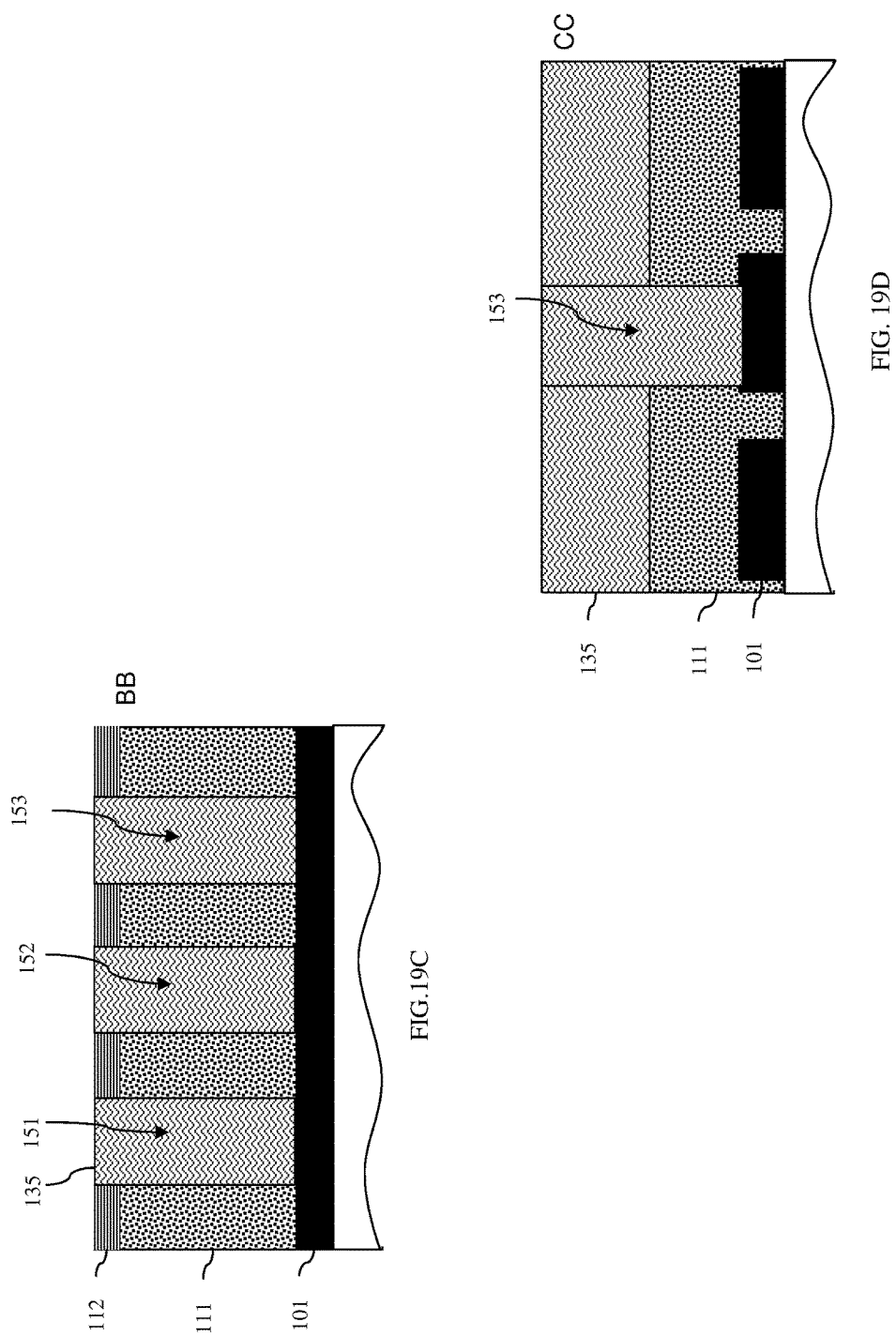

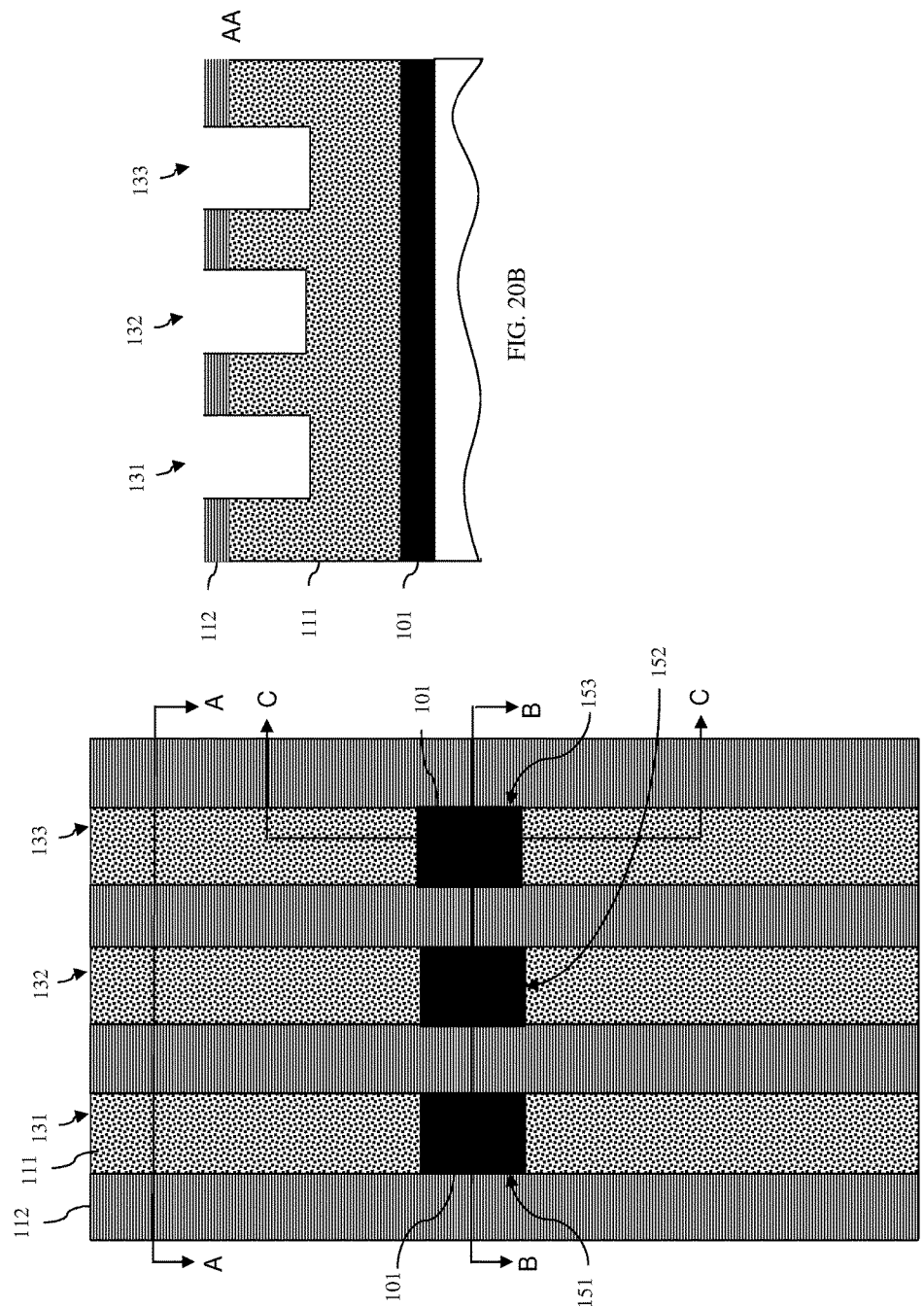

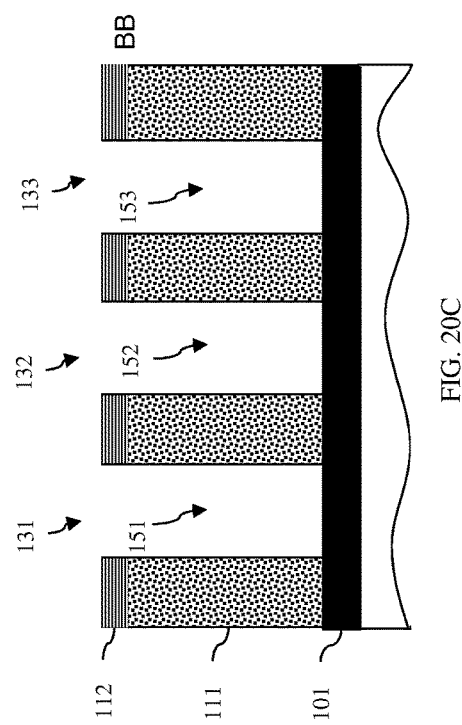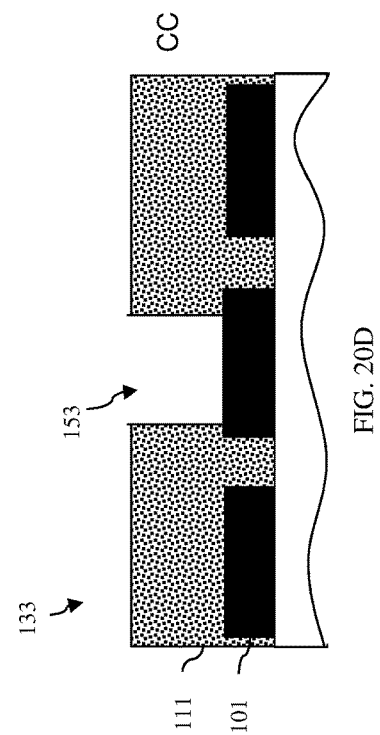

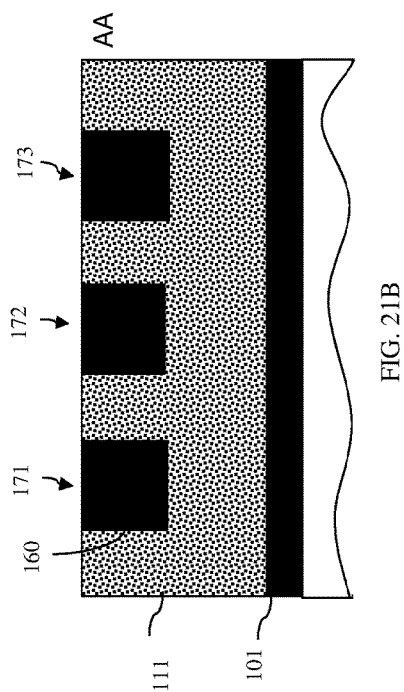
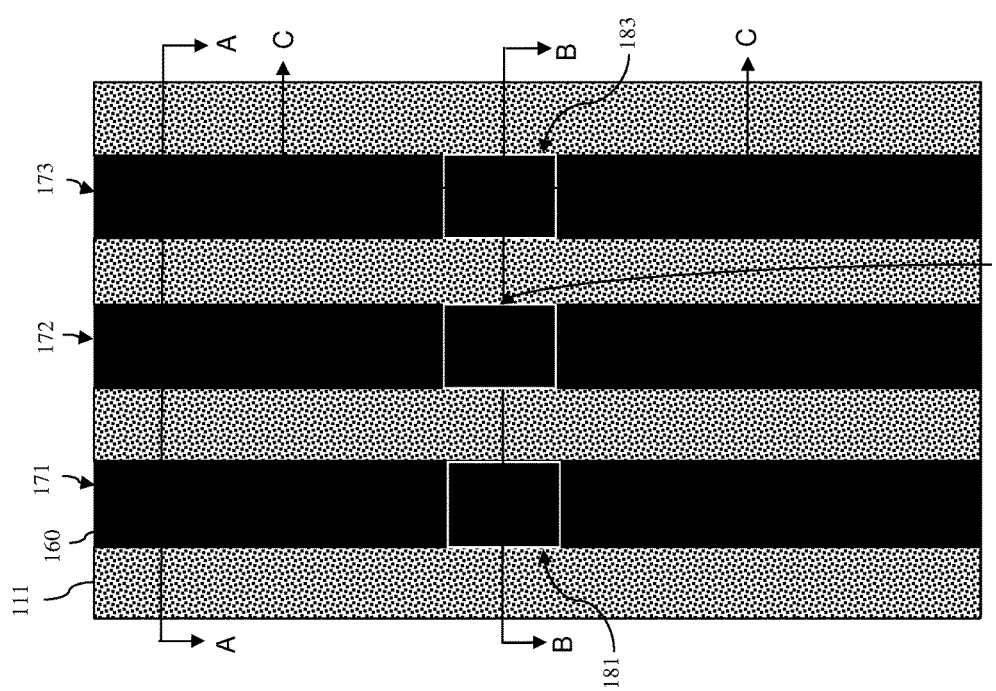

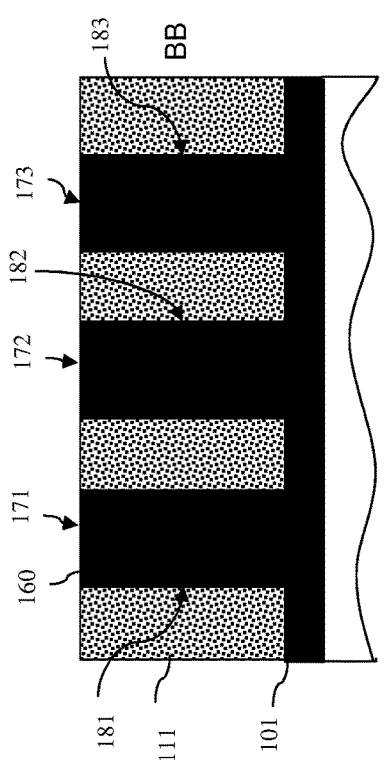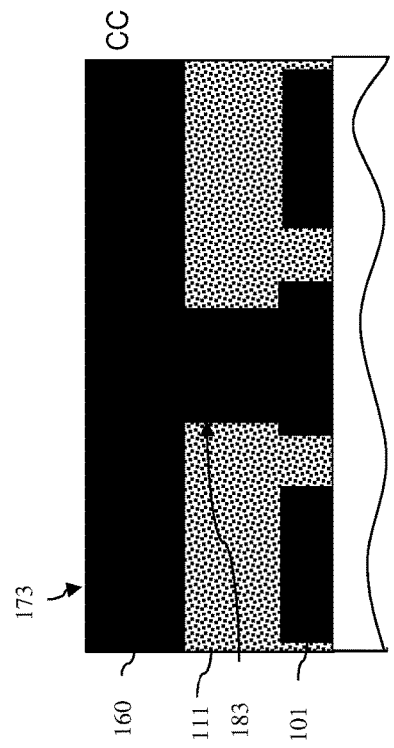

US 9,607,893 B1

METHOD OF FORMING SELF-ALIGNED METAL LINES AND VIAS

FIELD OF THE INVENTION

The present invention relates to back end of the line (BEOL) metal levels of integrated circuit (IC) structures and, more particularly, to a method for forming fully self-aligned metal lines and vias in the BEOL metal levels.

BACKGROUND

More specifically, in back end of the line (BEOL) processing, each metal level (e.g., $M_0$ to $M_x$) is formed so as to include metal lines (i.e., metal wires) and vias, which extend vertically from the metal lines to other metal lines below or, in the case of the first metal level, to semiconductor devices below. Typically, the metal lines and vias are formed using either discrete single damascene processes or a dual damascene process. Regardless of whether discrete single damascene processes or a dual damascene process are used, photolithography and etch processes are performed to pattern the via holes for the vias and separate photolithography and etch processes are performed to pattern the trenches for the metal lines. In other words, at each metal level, separate cut masks are required to form the via holes for the vias and the trenches for the metal lines, respectively. Requiring separate cut masks can be costly and time-consuming and can also result in voids, which are created by mask alignment problems and which can result in increased resistance and performance fails.

SUMMARY

In view of the foregoing, disclosed herein are embodiments of a method of back end of the line (BEOL) processing for an integrated circuit (IC) structure, wherein metal lines and vias of a metal level can be formed without requiring separate cut masks to pattern the trenches for the metal lines and the via holes for the vias. Specifically, in the method, one or more trenches for one or more metal lines can be formed (e.g., using a sidewall image transfer process) in an upper portion of a dielectric layer. Each trench can initially be filled with a sacrificial material. Then, a mask can be formed above the dielectric layer and patterned with one or more openings that expose one or more segments of the sacrificial material. Sidewall spacer(s) can be formed in the opening(s) and an etch process (e.g., a selective reactive ion etch (RIE) process) can be performed in order to form one or more via holes that extend through the sacrificial material and a lower portion of the dielectric layer (e.g., to metal lines or devices below). Subsequently, all the sacrificial material can be removed and the resulting trench(es) and via hole(s) can be filled with at least one metal, thereby forming self-aligned metal line(s) and via(s).

Disclosed herein is an embodiment of a method of back end of the line (BEOL) processing for an integrated circuit (IC) structure. In this embodiment, a metal level is formed by forming a multi-layer stack above, for example, metal lines in a lower metal level of the IC structure or above one or more devices in a device level of the IC structure. This multi-layer stack can include a first dielectric layer and a second dielectric layer above the first dielectric layer. A trench can be formed (e.g., using a sidewall image transfer (SIT) process) such that it extends through the second dielectric layer and into an upper portion of the first dielectric layer. This trench can be filled with a sacrificial material and a chemical mechanical polishing (CMP) process can be performed to remove all materials from above the second dielectric layer. Then, a mask can be formed on the multi-layer stack (i.e., on the second dielectric layer) and this mask can be patterned so as to have an opening aligned above a segment of the sacrificial material within the trench. A sidewall spacer can be formed in the opening such that a surface of the segment remains exposed. Next, a via hole, which extends vertically through the exposed segment and further through a lower portion of the first dielectric layer, can be etched (e.g., using a selective reactive ion etch (RIE) process). The via hole and the opening can then be filled with the same sacrificial material previously used to fill the trench and another CMP process can be performed to again remove all materials from above the second dielectric layer. The remaining sacrificial material can then be selectively removed from the trench and the via hole. Following removal of the sacrificial material, the trench and the via hole can be filled with at least one metal, thereby forming a metal line and a via, respectively.

Disclosed herein is another embodiment of a method of back end of the line (BEOL) processing for an integrated circuit (IC) structure. In this embodiment, a metal level is formed by forming a multi-layer stack above, for example, metal lines in a lower metal level of the IC structure or above one or more devices in a device level of the IC structure. This multi-layer stack can include a first dielectric layer and a second dielectric layer above the first dielectric layer. Multiple parallel trenches can be formed (e.g., using a sidewall image transfer (SIT) process) such that it extends through the second dielectric layer and into an upper portion of the first dielectric layer. The trenches can be filled with a sacrificial material and a chemical mechanical polishing (CMP) process can be performed to remove all materials from above the second dielectric layer. Then, a mask can be formed on the multi-layer stack (i.e., on the second dielectric layer) and this mask can be patterned so as to have openings aligned above segments of the sacrificial material within at least some of the trenches. Sidewall spacers can be formed in the openings such that, in each opening, a surface of a segment of the sacrificial material remains exposed. Next, via holes, which extend vertically through the exposed segments and further through a lower portion of the first dielectric layer, can be etched (e.g., using a selective reactive ion etch (RIE) process). The via holes and the openings can then be filled with the same sacrificial material previously used to fill the trenches and another CMP process can be performed to again remove all materials from above the second dielectric layer. The remaining sacrificial material can then be selectively removed from the trenches and the via holes. Following removal of the sacrificial material, the trenches and the via holes can be filled with at least one metal, thereby forming metal lines and vias, respectively.

Disclosed herein is yet another embodiment of a method of back end of the line (BEOL) processing for an integrated circuit (IC) structure. In this embodiment, a metal level is formed by forming a multi-layer stack above, for example, metal lines in a lower metal level of the IC structure or above one or more devices in a device level of the IC structure. This multi-layer stack can include a first dielectric layer and a second dielectric layer above the first dielectric layer. Multiple parallel trenches can be formed (e.g., using a sidewall image transfer (SIT) process) such that it extends through the second dielectric layer and into an upper portion of the first dielectric layer. The trenches can be filled with a sacrificial material and a chemical mechanical polishing (CMP) process can be performed to remove all materials from above the second dielectric layer. Then, a mask can be formed on the multi-layer stack (i.e., on the second dielectric layer) and this mask can be patterned with at least one opening that traverses two or more of the trenches such that it is aligned above segments of the sacrificial material in those trenches. A sidewall spacer can be formed in the opening such that a surface of each of the segments of the sacrificial material remains exposed. Next, via holes, which extend vertically through the exposed segments and further through a lower portion of the first dielectric layer, can be etched (e.g., using a selective reactive ion etch (RIE) process). The via holes and the opening can then be filled with the same sacrificial material previously used to fill the trenches and another CMP process can be performed to again remove all materials from above the second dielectric layer. The remaining sacrificial material can then be selectively removed from the trenches and the via holes. Following removal of the sacrificial material, the trenches and the via holes can be filled with at least one metal, thereby forming metal lines and vias, respectively.

BRIEF DESCRIPTION OF THE SEVERAL VIEWS OF THE DRAWINGS

The present invention will be better understood from the following detailed description with reference to the drawings, which are not necessarily drawn to scale and in which:

FIGS. 2A-2C are different cross-section diagrams illustrating a partially completed IC structure formed according to the method of FIG. 1;

FIGS. 3A-3C are different cross-section diagrams illustrating a partially completed IC structure formed according to the method of FIG. 1;

FIGS. 5A-5C are different cross-section diagrams illustrating a partially completed IC structure formed according to the method of FIG. 1;

FIGS. 6A-6C are different cross-section diagrams illustrating a partially completed IC structure formed according to the method of FIG. 1;

FIGS. 7A-7C are different cross-section diagrams illustrating a partially completed IC structure formed according to the method of FIG. 1;

FIGS. 8A-8D are different cross-section diagrams illustrating a partially completed IC structure formed according to a first embodiment of the method shown in FIG. 1;

FIGS. 9A-9D are different cross-section diagrams illustrating a partially completed IC structure formed according the first embodiment of the method shown in FIG. 1;

FIGS. 10A-10D are different cross-section diagrams illustrating a partially completed IC structure formed according the first embodiment of the method shown in FIG. 1;

FIGS. 11A-11D are different cross-section diagrams illustrating a partially completed IC structure formed according the first embodiment of the method shown in FIG. 1;

FIGS. 12A-12D are different cross-section diagrams illustrating a partially completed IC structure formed according the first embodiment of the method shown in FIG. 1;

FIGS. 13A-13D are different cross-section diagrams illustrating a partially completed IC structure formed according the first embodiment of the method shown in FIG. 1;

FIGS. 14A-14D are different cross-section diagrams illustrating a partially completed IC structure formed according the first embodiment of the method shown in FIG. 1;

FIGS. 15A-15D are different cross-section diagrams illustrating a partially completed IC structure formed according a second embodiment of the method shown in FIG. 1;

FIGS. 16A-16D are different cross-section diagrams illustrating a partially completed IC structure formed according the second embodiment of the method shown in FIG. 1;

FIGS. 17A-17D are different cross-section diagrams illustrating a partially completed IC structure formed according the second embodiment of the method shown in FIG. 1;

FIGS. 18A-18D are different cross-section diagrams illustrating a partially completed IC structure formed according the second embodiment of the method shown in FIG. 1;

FIGS. 19A-19D are different cross-section diagrams illustrating a partially completed IC structure formed according the second embodiment of the method shown in FIG. 1;

FIGS. 20A-20D are different cross-section diagrams illustrating a partially completed IC structure formed according the second embodiment of the method shown in FIG. 1; and, FIGS. 21A-21D are different cross-section diagrams illustrating a partially completed IC structure formed according the second embodiment of the method shown in FIG. 1.

DETAILED DESCRIPTION

As mentioned above, in back end of the line (BEOL) processing, each metal level (e.g., $M_0$ to $M_x$) is formed so as to include metal lines (i.e., metal wires) and vias, which extend vertically from the metal lines to other metal lines below or, in the case of the first metal level, to semiconductor devices below. Typically, the metal lines and vias are formed using either discrete single damascene processes or a dual damascene process. Regardless of whether discrete single damascene processes or a dual damascene process are used, photolithography and etch processes are performed to pattern the via holes for the vias and separate photolithography and etch processes are performed to pattern the trenches for the metal lines. In other words, at each metal level, separate cut masks are required to form the via holes for the vias and the trenches for the metal lines, respectively. Requiring separate cut masks can be costly and time-consuming and can also result in voids, which are created by mask alignment problems and which can result in increased resistance and performance fails.

In view of the foregoing, disclosed herein are embodiments of a method of back end of the line (BEOL) processing for an integrated circuit (IC) structure, wherein metal lines (also referred to herein as metal wires) and vias of a metal level can be formed without requiring separate cut masks to pattern the trenches for the metal lines and the via holes for the vias. Specifically, in the method, one or more trenches for one or more metal lines can be formed (e.g., using a sidewall image transfer process) in an upper portion of a dielectric layer. Each trench can initially be filled with a sacrificial material. Then, a mask can be formed above the dielectric layer and patterned with one or more openings that expose one or more segments of the sacrificial material. Sidewall spacer(s) can be formed in the opening(s) and an etch process (e.g., a selective reactive ion etch (RIE) process) can be performed in order to form one or more via holes that extend through the sacrificial material and a lower portion of the dielectric layer (e.g., to metal lines or devices below). Subsequently, all the sacrificial material can be removed and the resulting trench(es) and via hole(s) can be filled with at least one metal, thereby forming self-aligned metal line(s) and via(s).

Figure 1:
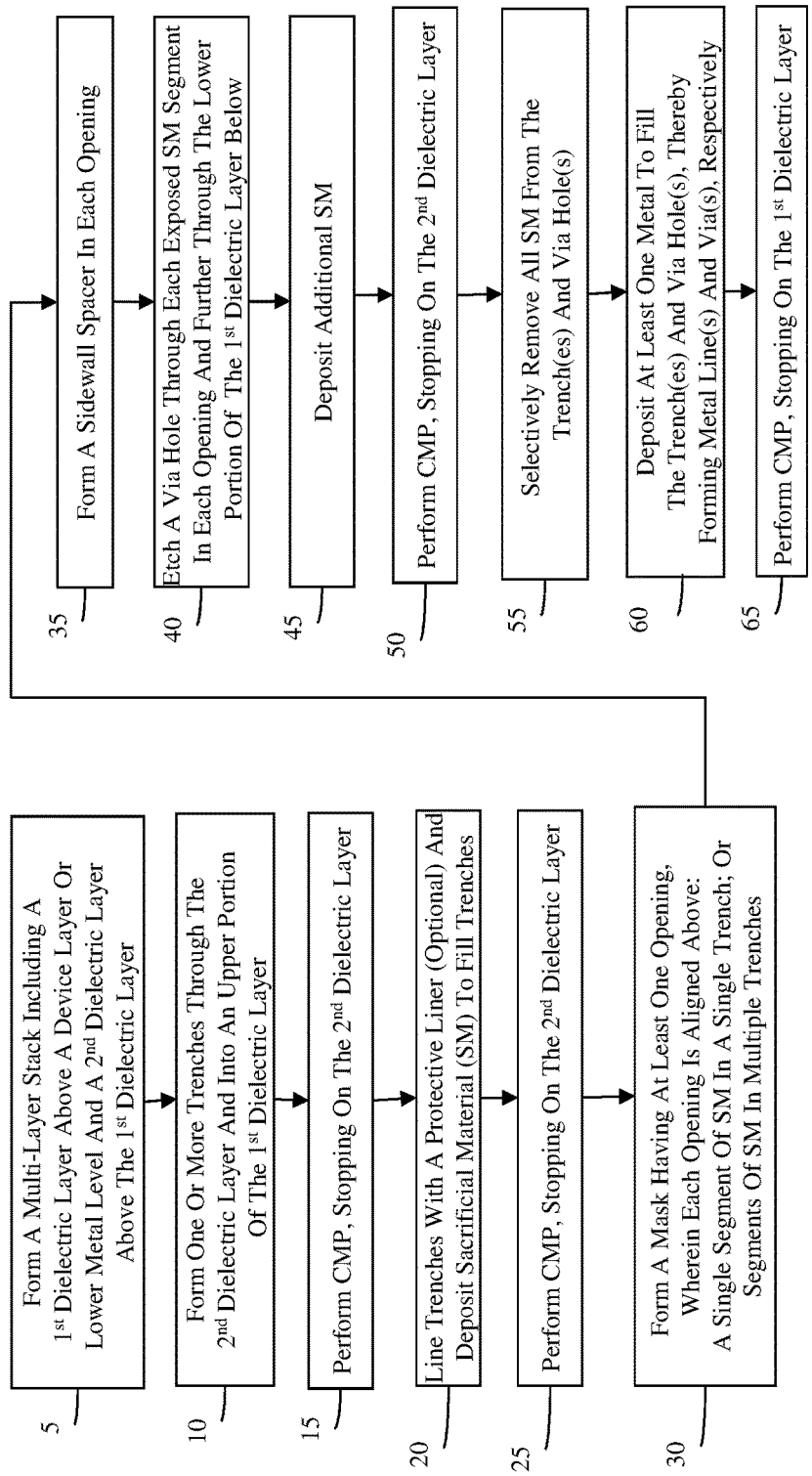
FIG. 1 is a flow diagram FIG. 1 illustrating disclosed methods of back end of the line (BEOL) processing for an integrated circuit (IC) structure.

More particularly, referring to the flow diagram of FIG. 1, disclosed herein are embodiments of a method of back end of the line (BEOL) processing for an integrated circuit (IC) structure. In the method, a metal level (e.g., $M_0$ to $M_x$) can be formed by first forming a multi-layer stack (5). As illustrated in FIGS. 2A-2C, this multi-layer stack can include a first dielectric layer 111 and a second dielectric layer 112 above the first dielectric layer. The second dielectric layer 112 can be different from the first dielectric layer 111. For example, the first dielectric layer 111 can be a layer of interlayer dielectric (ILD) material such as silicon oxide or any other suitable ILD material (e.g., borophosphosilicate glass (BPS G), tetraethyl orthosilicate (TEOS), fluorinated tetraethyl orthosilicate (FTEOS), etc.). The first dielectric layer 111 can, for example, be a porous ULK dielectric material. Those skilled in the art will recognize that a "low K dielectric material" refers to a dielectric material with a dielectric constant (K) that is lower than the dielectric constant of silicon dioxide ($SiO_2$) (i.e., that is lower approximately 4), whereas an "ultra-low K dielectric material" refers to a dielectric material with a dielectric constant (K) that is lower than approximately 2.7. Such ULK dielectric materials can be achieved by introducing pores into dielectric films. The second dielectric layer 112 can be a hard mask layer and, particularly, can be a titanium nitride layer, a tantalum nitride layer, a silicon nitride layer or other suitable hard mask layer. The second dielectric layer 112 can be relatively thin as compared to the first dielectric layer 111. For example, the first dielectric layer 111 can range in thickness from 75-125 nm (e.g., 100 nm) and the second dielectric layer 112 can range in thickness from 15-35 nm (e.g., 25 nm). In any case, the multi-layer stack can be formed above metal lines 101 in a lower metal level of the IC structure, as shown. Alternatively, when forming the first metal level ($M_0$), this multi-layer stack can be formed above one or more devices in a device level of the IC structure (not shown).

Figures 4A, 4B, 4C:
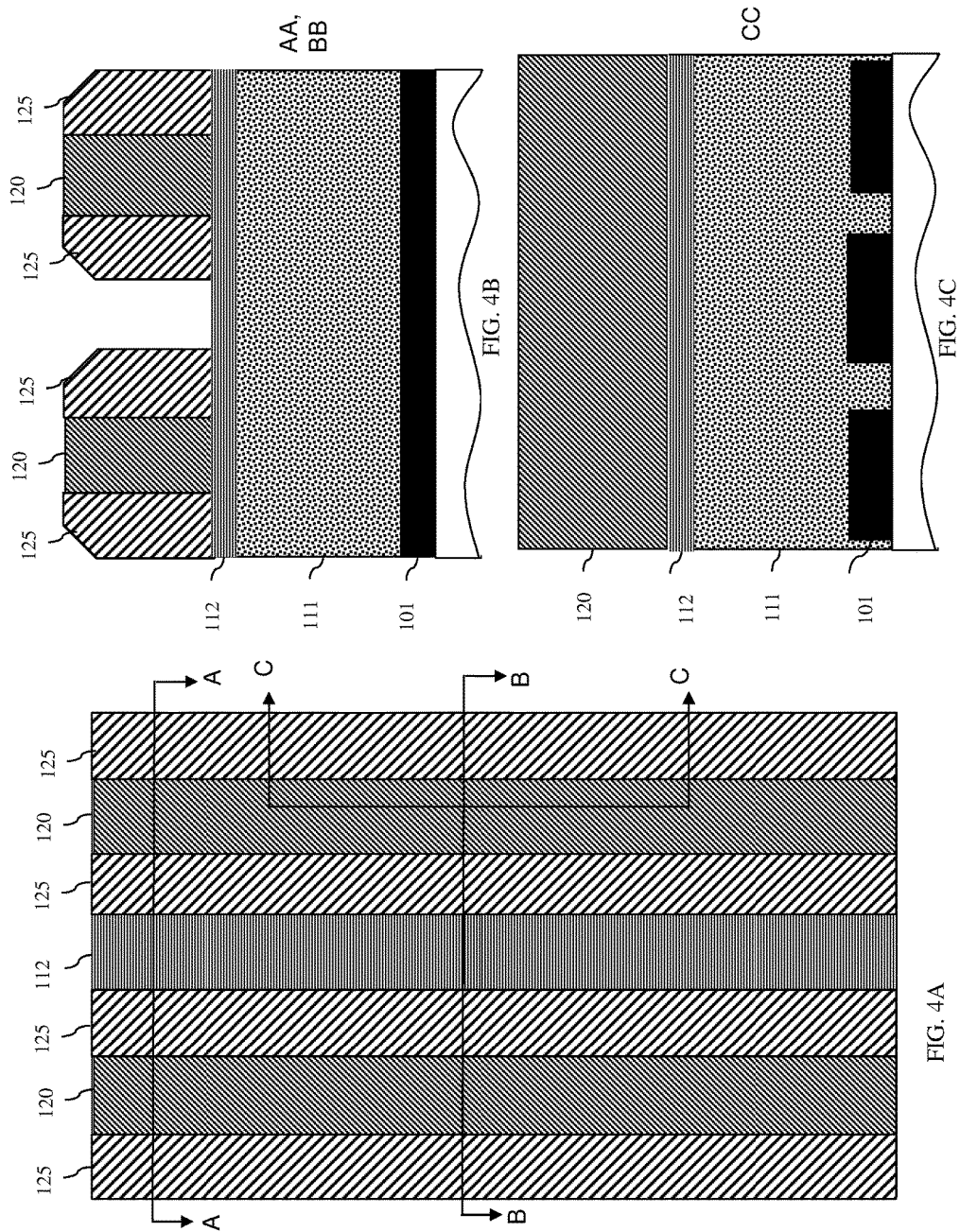
FIGS. 4A-4C are different cross-section diagrams illustrating a partially completed IC structure formed according to the method of FIG. 1.
Figure 13C:
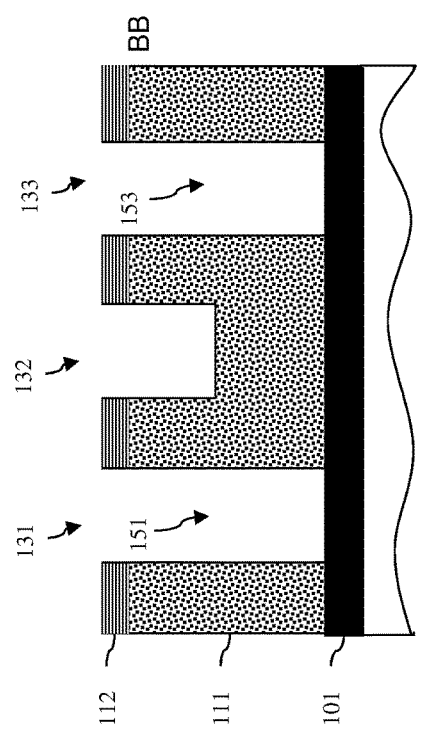
Figure 13D:
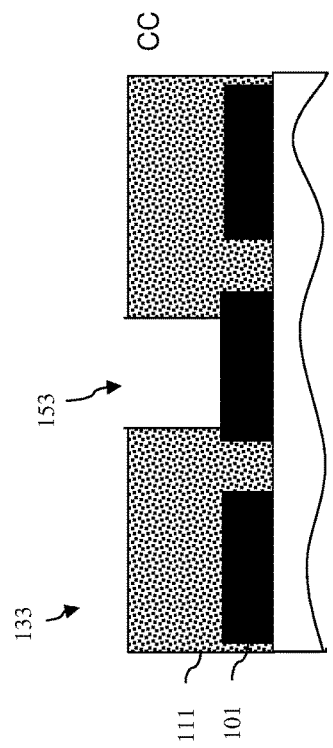
Figure 14D:
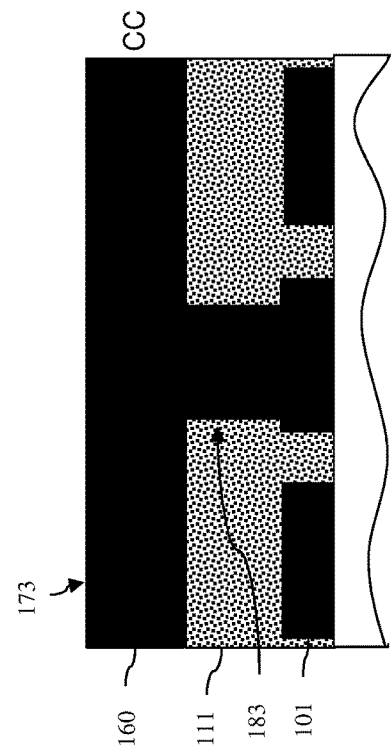
Figure 14C:
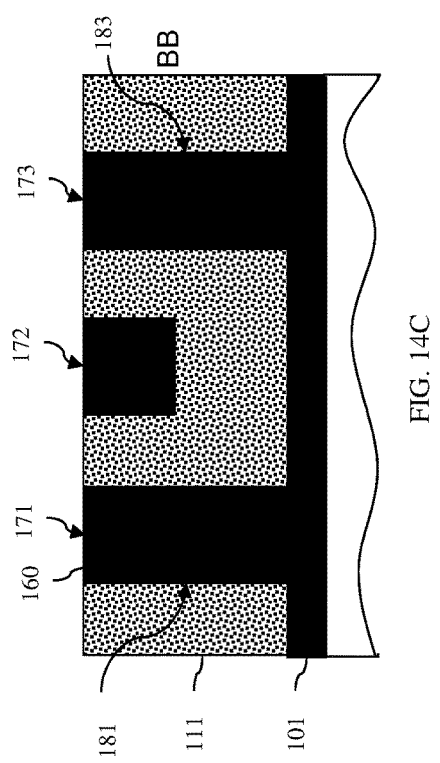

Next, one or more trenches for metal lines can be formed in the multi-layer stack (10). Specifically, substantially parallel trenches can be formed in the multi-layer stack so that each trench extends through the second dielectric layer 112 and into an upper portion of the first dielectric layer 111. The trenches can be formed at process 10 using, for example, a sidewall image transfer (SIT) process. That is, one or more mandrels 120 can be formed (e.g., lithographically patterned and etched) on the top surface of the second dielectric layer 112 (see FIGS. 3A-3C). The mandrels 120 can be formed, for example, from an organic dielectric layer (ODL) so as to have an essentially rectangular shape. The ODL can be, for example, an organic polymer layer, such as a photosensitive organic polymer layer, or other suitable ODL. For purposes of illustration, two mandrels are shown in the Figures; however, it should be understood that any number of one or more mandrels could be formed. After formation of the mandrels 120, dielectric sidewall spacer material can be conformally deposited over the mandrels 120. Then, a directional etch process (e.g., an anisotropic etch process) can be performed to etch the spacer material from horizontal surfaces at a greater rate than from vertical surfaces, thereby leaving spacer material (i.e., sidewall spacers 125) along the vertical sidewalls of mandrels 120 and exposing the top surfaces of the mandrels 120 (e.g., as shown in FIGS. 4A-4C). The dielectric sidewall spacer material can, for example, be an oxide material (e.g., silicon dioxide ($SiO_2$)) or other suitable dielectric sidewall spacer material that is different from the material of the mandrels 120. Next, the mandrels 120 can be selectively removed (e.g., by a selective etch process (e.g., a selective reactive ion etch (RIE) process). Once the mandrels 120 are removed, the pattern of the sidewall spacers 125 can be selectively etched (e.g., by a selective RIE process) into the multi-layer stack and, particularly, through the second dielectric layer 112 and into an upper portion of the first dielectric layer 111, thereby forming trenches (e.g., see trenches 131, 132 and 133) for the metal lines (e.g., as shown in FIGS. 5A-5C). Formation of the trench(es) at process 10 can be followed by the performance of a chemical mechanical polishing (CMP) process to remove all materials from above the top surface of the second dielectric layer 112 (15, see FIGS. 6A-6C).

A protective liner can, optionally, be conformally deposited so as to line each of the trenches 131, 132 and 133 and sacrificial material 135 can be deposited to fill each of the trenches 131, 132, and 133 (20). The protective liner can be, for example, a silicon nitride (SiN) liner, a silicon carbon nitride (SiCN) liner or other suitable protective liner. The use of such a protective liner is typically warranted when the first dielectric layer 111 is a porous ULK dielectric material. In any case, the sacrificial material 135 can be an organic dielectric material or other suitable organic dielectric material. The sacrificial material 135 can, for example, be an organic photosensitive polymer material (such as a negative tone photoresist). Optionally, the sacrificial material 135 can be the same material previously used for the mandrels 120. Following process 20, a chemical mechanical polishing (CMP) process can be performed to remove all materials from above the top surface of the second dielectric layer 112 (25, see FIGS. 7A-7C).

In each of the embodiments of the method shown in the flow diagram of FIG. 1, a mask 140 can be formed on the multi-layer stack (i.e., on the second dielectric layer 112) (30).

In a first embodiment of the method, which is described in detail below and illustrated in FIGS. 8A-8D through FIGS. 14A-14D, the mask 140 can be formed at process 30 such that it has one or more openings and such that each opening is aligned above a single corresponding segment of the sacrificial material 135 within a single one of the trenches. In a second embodiment of the method, which is also described in detail below and illustrated in FIGS. 15A-15D through FIGS. 21A-21D, the mask 140 can be formed at process 30 such that it has one or more openings and such that each opening traverses two or more of the trenches and is, thereby aligned above multiple different segments of the sacrificial material 135 within adjacent trenches.

More specifically, in the first embodiment of the method, the mask 140 formed at process 30 can, for example, be a silicon dioxide ($SiO_2$) mask (e.g., a low-temperature oxide (LTO) mask) or other suitable dielectric mask. The mask 140 can range in thickness from 10-30 nm (e.g., 20 nm). The mask 140 can be lithographically patterned and etched so as to have one or more openings and such that each of these openings is aligned above a single corresponding segment of the sacrificial material 135 within a single one of the trenches. For example, the mask 140 can be lithographically patterned and etched so as to have an opening 141 aligned above a segment of the sacrificial material 135 in the trench 131 and so as to have another opening 143 aligned above a segment of the sacrificial material 135 in the trench 133. It should be noted that these opening(s) can also expose surfaces of the second dielectric layer 112 adjacent to the sacrificial material 135.

A sidewall spacer 144 (also referred to herein as a cut area spacer) can then be formed in each of the openings 141 and 143 such that at least a portion of the top surface of the segment of sacrificial material in each opening remains exposed (35, see FIGS. 9A-9D). Specifically, dielectric sidewall spacer material can be conformally deposited over the mask 140 and in each of the openings 141 and 143. Then, a directional etch process (e.g., an anisotropic etch process) can be performed to etch the spacer material away from horizontal surfaces at a greater rate than from vertical surfaces, thereby leaving spacer material (i.e., sidewall spacers 144) along the vertical sidewalls of the mask 140 within each of the openings 141 and 143. The dielectric sidewall spacer material can, for example, be silicon nitride (SiN) or any other suitable dielectric sidewall spacer material that is different from the material used for the mask 140 and sacrificial material 135.

A selective etch process, such as a selective reactive ion etch (RIE) process, can subsequently be performed in order to form a via hole in each opening (40, see FIGS. 10A-10D). For example, the selective etch process can be performed to form a via hole 151 that extends vertically through the exposed surface of the segment of the sacrificial material 135 in the trench 131 in the opening 141 and further through the lower portion of the first dielectric layer 111. This same selective etch process can also form a via hole 153 that extends vertically through the exposed surface of the segment of the sacrificial material 135 in the trench 133 in the opening 143 and further through the lower portion of the first dielectric layer 111. It should be noted that the mask 140 and sidewall spacer 144 materials should be selected so that only exposed surfaces of the sacrificial material 135 and the first dielectric layer 111 below are etched during this process. The via holes 151 and 153 can land, for example, on metal lines 101 of a lower metal level (as shown) or, in the case of formation of metal lines and vias in the first metal level ($M_0$), on devices in the device level below. It should be noted that the size of each of the openings 141 and 143 patterned into the mask 140 at process 30 and the width of the sidewall spacer 144 formed within each opening at process 35 can be selectively adjusted in order to define the size of the "cut area" or, more particularly, to selectively adjust the size of the exposed surface of the segment of the sacrificial material 135 to be etched and, thereby the size of each via hole 151 and 153 formed at process 40.

The sacrificial material 135 can again be deposited to fill each of the via holes 151 and 153 and to further fill each of the openings 141 and 142 (45, see FIGS. 11A-11D). After deposition of the sacrificial material 135 at process 45, a CMP process can again be performed to remove all materials from above the top surface of the second dielectric layer 112 (50, see FIGS. 12A-12D). Next, any remaining sacrificial material 135 can be selectively removed from the structure and, particularly, from the trenches 131, 132, and 133 and from the via holes 151 and 153 (55, see FIGS. 13A-13D). For example, if the sacrificial material 135 is a negative tone photoresist material, it can be selectively dissolved in a photoresist developer solution.

Following removal of the sacrificial material 135 at process 55, at least one metal 160 can be deposited so as to fill the trenches 131, 132, and 133 and the via holes 151 and 153 and yet another CMP process can be performed to remove all materials from above the top surface of the first dielectric layer 111, thereby forming metal lines 171, 172 and 173 and conductive vias 181 and 183, respectively (60-65, see FIGS. 14A-14D). Specifically, a conductive diffusion barrier layer can, optionally, be conformally deposited so as to line the trenches 131, 132 and 133 and via holes 151 and 153. The conductive diffusion barrier layer can be any suitable conductive material that exhibits high atomic diffusion resistance (i.e., that exhibits low atomic diffusivity) such as cobalt, chromium, ruthenium, tantalum, tantalum nitride, indium oxide, tungsten, tungsten nitride, titanium, titanium nitride, or any other suitable conductive barrier material as described above. Next, the trenches 131, 132, and 133 and via holes 151 and 153 can be filled with a metal material 160. This metal material can be, for example, copper. Alternatively, the metal material can be any suitable metal material for metal level wire formation.

For purposes of illustration, three metal lines and two conductive vias were formed using the first method embodiment described above. However, it should be understood that this first method embodiment could, alternatively, be used to form any number of one or more metal lines and one or more conductive vias extending from the metal line(s) to a metal level or device level below.

Referring again to process 30 of FIG. 1, in the second embodiment of the method, the mask 140 can be formed such that it has one or more openings and such that each opening traverses two or more of the previously formed trenches and is, thereby aligned above segments of the sacrificial material 135 within adjacent trenches.

More specifically, in the second embodiment of the method, the mask 140 formed at process 30 can, for example, be a silicon dioxide ($SiO_2$) mask (e.g., a low-temperature oxide (LTO) mask) or other suitable dielectric mask. The mask 140 can range in thickness from 10-30 nm (e.g., 20 nm). The mask 140 can be lithographically patterned and etched so as to have one or more openings and such that each opening traverses two or more of the previously formed trenches and is, thereby aligned above segments of the sacrificial material 135 within adjacent trenches (30, see FIGS. 15A-15D). For example, the mask 140 can be lithographically patterned and etched so as to have an opening 145 aligned above and exposing segments of the sacrificial material 135 in the trenches 131, 132 and 133. It should be noted that this opening can also expose surfaces of the second dielectric layer 112 adjacent to the exposed segments of sacrificial material.

A sidewall spacer 144 (also referred to herein as a cut area spacer) can then be formed in the opening 145 such that at least portions of the top surfaces of each of the segments of sacrificial material in each trench 131, 132, and 133 in the opening 145 remain exposed (35, see FIGS. 16A-16D). Specifically, dielectric sidewall spacer material can be conformally deposited over the mask 140 and in the opening 145. Then, a directional etch process (e.g., an anisotropic etch process) can be performed to etch the spacer material from horizontal surfaces at a greater rate than from vertical surfaces, thereby leaving spacer material (i.e., sidewall spacer 144) along the vertical sidewalls of the mask 140 in the opening 145. The dielectric sidewall spacer material can, for example, be silicon nitride (SiN) or other suitable dielectric sidewall spacer material that is different from the material of the mask 140 and sacrificial material 135.

A selective etch process, such as a selective reactive ion etch (RIE) process, can be performed in order to simultaneously form multiple via holes in the opening 145 (40, see FIGS. 17A-17D). For example, the selective etch process can be performed to form via holes 151, 152, and 153 that extend vertically through the exposed surfaces of the segments of the sacrificial material 135 in each trench 131, 132 and 133, respectively, within the opening 145 and further through the lower portion of the first dielectric layer 111. It should be noted that, as in the previously described embodiment, the mask 140 and sidewall spacer 144 materials should be selected so that only exposed surfaces of the sacrificial material 135 and the first dielectric layer 111 below are etched during this process. Additionally, each via hole 151, 152, and 153 can land, for example, on a metal line 101 of a lower metal level (as shown) or, in the case of formation of metal lines and vias in the first metal level ($M_0$), on devices in the device level below. It should be noted that the size of the opening 145 patterned into the mask 140 at process 30 and the width of the sidewall spacer 144 formed within the opening 145 at process 35 can be selectively adjusted in order to define the size of the "cut area" or, more particularly, to selectively adjust the size of the exposed surfaces of the segments of the sacrificial material 135 to be etched and, thereby the size of each via hole 151, 152 and 153 formed at process 40.

The sacrificial material 135 can again be deposited to fill the via holes 151, 152 and 153 and to further fill the opening 145 (45, see FIGS. 18A-18D). After deposition of the sacrificial material 135 at process 45, a CMP process can again be performed to remove all materials from above the top surface of the second dielectric layer 112 (50, see FIGS. 19A-19D). Next, any remaining sacrificial material 135 can be selectively removed from the structure and, particularly, from the trenches 131, 132, and 133 and from the via holes 151, 152 and 153 (55, see FIGS. 20A-20D). For example, if the sacrificial material 135 is a negative tone photoresist material, it can be selectively dissolved in a photoresist developer solution.

Following removal of the sacrificial material 135 at process 55, at least one metal 160 can be deposited so as to fill the trenches 131, 132, and 133 and the via holes 151, 152 and 153 and yet another CMP process can be performed to remove all materials from above the top surface of the first dielectric layer 111, thereby forming metal lines 171, 172 and 173 and conductive vias 181, 182 and 183, respectively (60-65, see FIGS. 21A-21D). Specifically, a conductive diffusion barrier layer can, optionally, be conformally deposited so as to line the trenches 131, 132 and 133 and the via holes 151, 152 and 153. The conductive diffusion barrier layer can be any suitable conductive material that exhibits high atomic diffusion resistance (i.e., that exhibits low atomic diffusivity) such as cobalt, chromium, ruthenium, tantalum, tantalum nitride, indium oxide, tungsten, tungsten nitride, titanium, titanium nitride, or any other suitable conductive barrier material as described above. Next, the trenches 131, 132 and 133 and via holes 151, 152 and 153 can be filled with a metal material 160. This metal material can be, for example, copper. Alternatively, the metal material can be any suitable metal material for metal level wire formation.

For purposes of illustration, three metal lines and three conductive vias were shown as being formed using the second method embodiment described above. However, it should be understood that this second embodiment of the method could be used to form any number of two or more metal lines and two or more conductive vias extending from the metal line(s) to a metal level or device level below.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are embodiments of a method of back end of the line (BEOL) processing for an integrated circuit (IC) structure, wherein metal lines and vias of each metal level can be formed without requiring separate cut masks to pattern the trenches for the metal lines and the via holes for the vias. Specifically, in the method, one or more trenches for one or more metal lines can be formed (e.g., using a sidewall image transfer process) in an upper portion of a dielectric layer. Each trench can initially be filled with a sacrificial material. Then, a mask can be formed above the dielectric layer and patterned with one or more openings that expose one or more segments of the sacrificial material. Sidewall spacer(s) can be formed in the opening(s) and an etch process (e.g., a selective reactive ion etch (RIE) process) can be performed in order to form one or more via holes that extend through the sacrificial material and a lower portion of the dielectric layer (e.g., to metal lines or devices below). Subsequently, all the sacrificial material can be removed and the resulting trench(es) and via hole(s) can be filled with at least one metal, thereby forming self-aligned metal line(s) and via(s).

What is claimed is:

1. A method comprising:
forming a multi-layer stack comprising a first dielectric layer and a second dielectric layer above the first dielectric layer;
forming a trench through the second dielectric layer and into an upper portion of the first dielectric layer;
filling the trench with a sacrificial material;
forming, on the stack, a mask with an opening aligned above a segment of the sacrificial material;
forming a sidewall spacer in the opening such that a surface of the segment remains exposed;
etching a via hole that extends through the segment and a lower portion of the first dielectric layer; and,
removing all materials from above the second dielectric layer and any remaining sacrificial material.

2. The method of claim 1, further comprising filling the trench and the via hole with at least one conductive material to form a metal line and a via, respectively.

3. The method of claim 1, the forming of the trench comprising performing a sidewall image transfer process.

4. The method of claim 1, further comprising, before the filling of the trench with the sacrificial material, lining the trench with a protective liner.

5. The method of claim 1, the sacrificial material comprising an organic dielectric material.

6. The method of claim 1, the forming of the sidewall spacer comprising selectively adjusting a width of the sidewall spacer so as to selectively adjust a size of the via hole.

7. The method of claim 1, the first dielectric layer comprising a porous dielectric material with a dielectric constant of less than 2.7, the second dielectric layer comprising a nitride layer and the mask comprising an oxide layer.

8. A method comprising:
forming a multi-layer stack comprising a first dielectric layer and a second dielectric layer above the first dielectric layer;
forming multiple parallel trenches through the second dielectric layer and into an upper portion of the first dielectric layer;
filling the trenches with a sacrificial material;
forming, on the stack, a mask with openings aligned above segments of the sacrificial material in the trenches;
forming sidewall spacers in the openings such that, in each opening, a surface of a segment of the sacrificial material remains exposed;
etching via holes that extend through the segments and a lower portion of the first dielectric layer;
filling the via holes and the openings with the sacrificial material;
performing a chemical mechanical polishing process to remove all materials from above the second dielectric layer; and,
selectively removing any remaining sacrificial material from the trenches and the via holes.

9. The method of claim 8, further comprising filling the trenches and the via holes with at least one conductive material to form metal lines and vias, respectively.

10. The method of claim 8, the forming of the trenches comprising performing a sidewall image transfer process.

11. The method of claim 8, further comprising, before the filling of the trenches with the sacrificial material, lining the trenches with a protective liner.

12. The method of claim 8, the sacrificial material comprising an organic dielectric material.

13. The method of claim 8, the forming of the sidewall spacers comprising selectively adjusting a width of the sidewall spacers so as to selectively adjust a size of the via holes.

14. The method of claim 8, the first dielectric layer comprising a porous dielectric material with a dielectric constant of less than 2.7, the second dielectric layer comprising a nitride layer and the mask comprising an oxide layer.

15. A method comprising:
forming a multi-layer stack comprising a first dielectric layer and a second dielectric layer above the first dielectric layer;
forming multiple parallel trenches through the second dielectric layer and into an upper portion of the first dielectric layer;
filling the trenches with a sacrificial material;
forming, on the stack, a mask with an opening that traverses multiple ones of the trenches so as to be aligned above segments of the sacrificial material in the trenches;
forming a sidewall spacer in the opening such that a surface of each of the segments of the sacrificial material remains exposed;
etching via holes that extend through the segments and a lower portion of the first dielectric layer;
filling the via holes and the opening with the sacrificial material;
performing a chemical mechanical polishing process to remove all materials from above the second dielectric layer; and,
selectively removing any remaining sacrificial material from the trenches and the via holes.

16. The method of claim 15, further comprising filling the trenches and the via holes with at least one metal to form metal lines and vias, respectively.

17. The method of claim 15, the forming of the trenches comprising performing a sidewall image transfer process.

18. The method of claim 15, further comprising, before the filling of the trenches with the sacrificial material, lining the trenches with a protective liner.

19. The method of claim 15, the sacrificial material comprising an organic dielectric material.

20. The method of claim 15, the forming of the sidewall spacers comprising selectively adjusting a width of the sidewall spacer so as to selectively adjust a size of the via holes.

* * * * *